(12) United States Patent
Taito et al.

(10) Patent No.: US 6,472,926 B2
(45) Date of Patent: Oct. 29, 2002

(54) INTERNAL VOLTAGE GENERATION CIRCUIT

(75) Inventors: Yasuhiko Taito, Hyogo (JP); Akira Yamazaki, Hyogo (JP); Fukashi Morishita, Hyogo (JP); Mako Kobayashi, Hyogo (JP); Mihoko Akiyama, Hyogo (JP); Nobuyuki Fujii, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/760,639

(22) Filed: Jan. 17, 2001

(65) Prior Publication Data

US 2002/0008566 A1 Jan. 24, 2002

(30) Foreign Application Priority Data

Jul. 18, 2000 (JP) ........................ 2000-217170

(51) Int. Cl.[7] ................................ G05F 1/10
(52) U.S. Cl. ...................................... 327/536
(58) Field of Search ...................... 327/530, 534, 327/535, 536, 537

(56) References Cited

U.S. PATENT DOCUMENTS

| | | | | |
|---|---|---|---|---|
| 5,767,735 A | * | 6/1998 | Javanifard et al. | 327/536 |
| 5,781,494 A | * | 7/1998 | Bae et al. | 365/230.03 |
| 5,909,141 A | * | 6/1999 | Tomishima | 327/536 |
| 6,128,242 A | * | 10/2000 | Banba et al. | 365/226 |
| 6,208,198 B1 | * | 3/2001 | Lee | 327/536 |
| 6,239,650 B1 | * | 5/2001 | Tsay et al. | 327/536 |
| 6,268,761 B1 | * | 7/2001 | Naganawa | 327/536 |

FOREIGN PATENT DOCUMENTS

| | | |
|---|---|---|
| JP | 2-179264 | 7/1990 |
| JP | 9-180448 | 7/1997 |

OTHER PUBLICATIONS

"A 35ns 64Mb DRAM Using On–Chip Boosted Power Supply," by Lee et al., 1992 Symposium of VLSI Circuits Digest of Technical Papers, pp. 64–65.

* cited by examiner

Primary Examiner—Jeffrey Zweizig
(74) Attorney, Agent, or Firm—McDermott, Will & Emery

(57) ABSTRACT

A plurality of pump modules are provided, the number of pump modules to be activated is changed depending on a mode of operation, and the number of pump modules to be activated is also adjusted with the specification of interest taken into consideration. There can be provided an internal voltage generation circuit occupying a small area and readily capable of accommodating a change in specification.

18 Claims, 13 Drawing Sheets

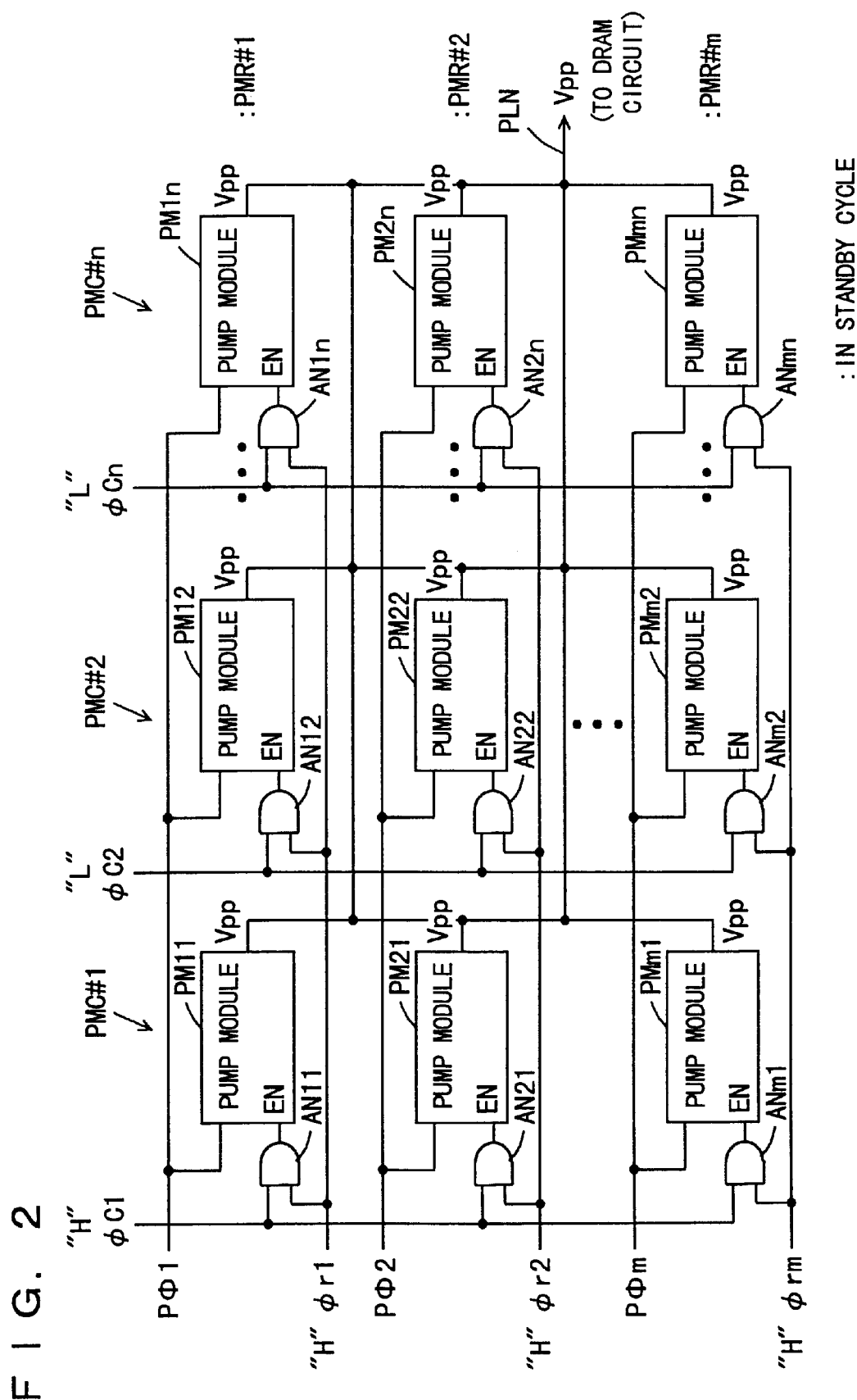
F I G. 2

PUMP MODULE NOT USED
PRESENT ON CHIP

IT MAY BE ARRANGED FOR EACH
PREDETERMINED NUMBER OF PUMP
COLUMN BLOCKS, OR MAY BE COMMONLY
TO ALL PUMP COLUMN BLOCKS

INTERNAL VOLTAGE GENERATION CIRCUIT

BACKGROUND OF THE INVENTION

1. Field of the Invention

The present invention relates to internal voltage generation circuits and particularly to a configuration of a circuit for generating a boosted voltage used in a dynamic random access memory.

2. Description of the Background Art

A dynamic random access memory (DRAM), widely used as main memory, is formed mainly through a CMOS (complementary metal-insulating film-semiconductor) process. The DRAM has a memory cell configured of a capacitor and a single access transistor. This access transistor is generally formed of an n-channel MOS transistor having a larger charge driving capability than a p-channel MOS transistor (an insulated gate field effect transistor).

To store data of a high level in this memory cell capacitor, a boosted voltage Vpp higher than a normal voltage corresponding to high level data is applied to a gate of the access transistor, with its threshold voltage loss considered. Typically, the DRAM is internally provided with a booster circuit (a Vpp generation circuit) for obtaining boosted voltage Vpp from an external power supply voltage ExVdd supplied from an outside of the chip (DRAM). Incorporating the Vpp generation circuit reduces current consumption due to dispensable charging and discharging a line transmitting the boosted voltage, and simplifies a system power supply arrangement, as compared to a configuration of externally generating boosted voltage Vpp and supplying boosted voltage Vpp to a DRAM.

FIG. 24 shows an example of a configuration of a conventional Vpp generation circuit. In FIG. 24, the Vpp generation circuit includes a rectifying element (a diode) D1 connected between an external power supply node ND1 and a node ND2, a rectifying element D2 connected between node ND2 and an output node ND3, and a capacitance element C1 supplying electric charge to node ND2 in response to a pump clock signal $\phi$. Rectifying element D1 has an anode connected to external power supply node ND1 and a cathode connected to node ND2. Rectifying element D2 has an anode connected to node ND2 and a cathode connected to node ND3. Pump clock signal $\phi$ has a predetermined period and a predetermined amplitude.

When pump clock signal $\phi$ is at a low level, rectifying element D1 conducts and node ND2 is precharged to a voltage level of ExVdd−Vth. Herein, Vth represents a forward voltage drop of rectifying elements D1 and D2. When pump clock signal $\phi$ rises to a high level, node ND2 has its voltage level increased by an amplitude Vcc of pump clock signal $\phi$. More specifically, the voltage level of node ND2 increases to a voltage level of Vcc +ExVdd−Vth. Rectifying element D2 conducts as the voltage level of node ND2 increases, and rectifying element D2 supplies electric charge to node ND3 and increases boosted voltage Vpp in voltage level. By repeating this operation, boosted voltage Vpp rises to at most a voltage level of ExVdd+Vcc−2·Vth. If pump clock signal $\phi$ has an amplitude equal to external power supply voltage ExVdd, boosted voltage Vpp accordingly rises to a voltage level of 2·ExVdd−2·Vth.

In the Vpp generation circuit as shown in FIG. 24, capacitance element C1 has an charge supplying capability substantially proportional to the capacitance value of capacitance element C1, since Q=C·V.

FIG. 25 schematically shows a configuration of a portion generating boosted voltage Vpp in a conventional DRAM. In FIG. 25, an active Vpp generation circuit 902 and a standby Vpp generation circuit 904 are provided for a DRAM circuit 906. Active Vpp generation circuit 902 is activated in an active cycle of DRAM circuit 906 (when a memory cell select operation is performed) to generate boosted voltage Vpp. Standby Vpp generation circuit 904 normally operates and compensates for a reduction of boosted voltage Vpp caused by a leak current when DRAM circuit 906 is in a standby state. Therefore, standby Vpp generation circuit 904 is adapted to have a small current driving capability and active Vpp generation circuit 902 is adapted to have a large current driving capability. For example, boosted voltage Vpp is used not only for a word line drive signal but also for bit line isolation instructing signal in a shared sense amplifier configuration. Boosted voltage Vpp is also used for a bit line equalization instructing signal for equalizing bit lines, to rapidly precharge/equalize the bit lines.

In the active cycle, the bit line isolation and equalization instructing signals are charged and discharged (the signals are discharged when the active cycle starts and the signals are charged when the active cycle is completed) and further boosted voltage Vpp is consumed in selecting a word line. Therefore, in the active cycle, active Vpp generation circuit 902 having a large current driving capability is activated and generates boosted voltage Vpp with the large current driving capability reliably.

Typically, a DRAM has a plurality of modes of operation, and, as has been described previously, a Vpp generation circuit is required to have different current supplying capabilities for different modes of operation and the DRAM has a specification value of power consumption that varies in correspondence to the mode of operation. In a standby cycle, minimizing power consumption is required. Therefore, active Vpp generation circuit 902 having a large current supplying capability and a large power consumption and standby Vpp generation circuit 904 having a small current supplying capability and a small power consumption are used to supply DRAM circuit 906 with boosted voltage Vpp. Active Vpp generation circuit 902 and standby Vpp generation circuit 904 are selectively activated depending on a mode of operation of the DRAM circuit to satisfy a current supplying capability of a Vpp generation circuit and a specification value for power consumption of the DRAM.

Active Vpp generation circuit 902 and standby Vpp generation circuit 904 both utilize the charge pump circuit as shown in FIG. 24. If boosted voltage Vpp is generated by a charge pump circuit and boosted voltage Vpp has a voltage level dropping due to leak current or consumption thereof, boosted voltage Vpp varies in a saw-tooth form. More specifically, as shown in FIG. 26, when pump clock signal $\phi$ goes high, node ND2 has a voltage level increased from a precharge voltage level by an amplitude of pump clock signal $\phi$. In response to the increase of the voltage level, rectifying element D2 conducts and supplies electric charge to node ND3. In response to the supply of electric charge, boosted voltage Vpp has a voltage level increasing rapidly.

If boosted voltage Vpp drops in level because of consumption of boosted voltage Vpp through an operation of an internal circuit or because of a leak current through a leak path, node ND2 has a voltage level gradually lowered since electric charge is applied from node ND2 to node ND3 when pump clock signal $\phi$ is held high. When pump clock signal $\phi$ falls low, node ND2 has a voltage level once dropped and again rectifying element D1 allows node ND2 to return to the precharge voltage level. When pump clock signal φ is held low, rectifying element D2 does not conduct and boosted voltage Vpp continues to lower. This operation is repeated and boosted voltage Vpp has a saw-tooth like voltage waveform. In particular, in active Vpp generation circuit 902, capacitance element C1 has a capacitance value sufficiently increased to accommodate a large current consumption in the active cycle, and a large amount of electric charge is transferred to node ND2 and electric charge is rapidly supplied from node ND2 via rectifying element D2 to node ND3. Thus, the saw-tooth waveform becomes large in amplitude.

A circuit configuration employing a multi-phase clock signal to provide a charge pump operation, as shown in FIG. 27, to minimize the variation of boosted voltage Vpp can be used.

FIG. 27 schematically shows another configuration of the conventional Vpp generation circuit. In FIG. 27, the Vpp generation circuit includes rectifying elements D3 and D4 connected in series between an external power supply node ND1 and an output node ND3, rectifying elements D5 and D6 connected in parallel with rectifying elements D3 and D4 and in series between external power supply node ND1 and output node ND3, a capacitance element C2 performing a pump operation in response to a pump clock signal φ1 to supply electric charge to a node ND4 located between rectifying elements D3 and D4, and a capacitance element C3 supplying electric charge in response to a pump clock signal φ2 to a node ND5 located between rectifying elements D5 and D6. Capacitance elements C2 and C3 have a capacitance value C/2 corresponding to ½ of capacitance value C of the capacitance element in the circuit as shown in FIG. 24 using a single-phase pump clock signal. Further, pump clock signals φ1 and φ2 are two-phase clock signals complementary to each other. Now, an operation of the Vpp generation circuit as shown in FIG. 27 will be described with reference to the signal waveform diagram as shown in FIG. 28.

When pump clock signal φ1 has a high level, pump clock signal φ2 is at a low level. Therefore, when node ND4 has a voltage level increasing in response to pump clock signal φ1 and electric charge is supplied via rectifying element D4 to node ND3, node ND5 drops in voltage level and rectifying element D3 does not conduct. Thus, node ND3 receives electric charge in proportion to capacitance value C/2 of capacitance element C2 and boosted voltage Vpp at output node ND3 increases in level. This level of boosted voltage Vpp gradually drops due to consumption or leak current. When pump clock signal φ1 is held high, node ND4 receives electric charge from capacitance element C2, although node ND4 gradually drops in voltage level as output node ND3 drops in voltage level.

When pump clock signal φ1 falls low, pump clock signal φ2 goes high. Therefore, when a charge supply operation via rectifying element D4 is completed, electric charge is then supplied via rectifying element D6. Herein, capacitance element C3 has a capacitance value of C/2 equal to capacitance value C/2 of capacitance element C2 and boosted voltage Vpp is boosted with a boosting width reduced to correspond to ½ of an amplitude provided when a single-phase pump clock signal as shown in FIG. 24 is used. Therefore, if a two-phase clock signal is used as shown in FIG. 28, then boosted voltage Vpp has a saw-tooth waveform having half the amplitude of the saw-tooth waveform as shown in FIG. 26. Thus, boosted voltage Vpp can have a voltage level with a reduced variation. If a clock signal having more phases, such as a 4-phase clock signal, is used, boosted voltage Vpp can have a voltage level further reduced in variation.

In recent years, there has been provided, as one application of a DRAM, a system LSI having a large-scale logic circuit and a DRAM of a relatively small storage capacity integratedly mounted on a single semiconductor chip. Hereinafter a DRAM used for such an application will be referred to as an embedded DRAM. In such an application, the DRAM is required to have various storage capacities depending on a target application. In particular, if it is applied to portable equipment or the like, the DRAM is required to operate with low power supply voltage. Therefore, various requirements on specifications for a power supply voltage externally supplied to the DRAM are presented in some cases. Depending on the specification of interest, an operating power supply voltage required for a Vpp generation circuit varies, and depending on the application of interest, the DRAM is required to have a different storage capacity. Specifications for the charge supplying capability and current consumption and the like of the Vpp generation circuit vary accordingly With the assumption of such various specifications, if a Vpp generation circuit has a fixed configuration as shown in FIG. 25, then for an application to the DRAM requiring a small storage capacity there would exist a Vpp generation circuit having a capability larger than required and thus occupying an area larger than required. If a multi-phase pump clock signal is used and charge pump circuits are arranged for respective pump clock signals having different phases, the charge pump circuitry would have too large a pump driving capability for a DRAM of a small storage capacity. Therefore, the charge pump circuit needs to be redesign depending on the application or specification of interest, deteriorating the design efficiency.

FIG. 29 schematically shows another configuration of the Vpp generation circuitry. As shown in FIG. 29, the Vpp generation circuitry includes an active Vpp generation circuit 902 and a standby Vpp generation circuit 904 and a Vpp assisting/directly coupling circuit 908 provided at a different location. Vpp assisting/directly coupling circuit 908 includes an initial charge assisting circuit for rapidly driving boosted voltage Vpp to a predetermined voltage level upon power-on, and an external direct-coupling circuit for estimating or testing internal circuit (DRAM circuit) 906 even when boosted voltage Vpp is defective. The external direct-coupling circuit couples an external power supply node with a boosted voltage transmission line. Therefore, the initial charge assisting circuit is required to have a current driving capability matching with a current driving capability of Vpp generation circuits 902 and 904, and the external direct-coupling circuit is also required to have a current capability matching with the current driving capability of Vpp generation circuits 902 and 904. Therefore, if the DRAM has a changed specification and Vpp generation circuits 902 and 904 are accordingly have a changed specification, then a Vpp assisting/directly coupling circuit 908 is accordingly also required to be redesigned.

Therefore, if a conventional DRAM is subject to change in specification of storage capacity and in operating power supply voltage, an internal voltage generation circuit such as a Vpp generation circuit needs to be redesigned. Therefore it cannot flexibly accommodate a changed specification, disadvantageously resulting in an increased cost and an increased designing period.

SUMMARY OF THE INVENTION

An object of the present invention is to provide an internal voltage generation circuit capable of readily generating an internal voltage such as a boosted voltage, which is capable of readily accommodating a change in a specification.

Another object of the present invention is to provide an internal voltage generation circuit suitable for an embedded DRAM used for various applications.

Briefly state, an internal voltage generation circuit according to the present invention has a plurality of pump modules arranged therein, with the number of pump modules to be activated being adjusted depending on the charge supplying capability required.

More specifically, an internal voltage generation circuit according to the present invention includes a plurality of pump modules each performing a pump operation when active, to commonly generate an internal voltage on an internal voltage transmission line, and control circuitry coupled with the plurality of pump modules to generate a control signal for activating a pump module and transmit the generated control signal to the pump module. The control circuitry includes a circuit for setting the number of pump modules to be activated among the plurality of pump modules.

A plurality of pump modules are arranged and the number of pump modules to be simultaneously activated can be adjusted depending on the specification required. Therefore, if a change is made in a specification, such specification change can be accommodated simply by changing the number of pump modules to be activated. Therefore, it is not necessary to change the design of the entirety of the internal voltage generation circuit. Thus, the change in the specification can be readily accommodated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 represents a logic level of each pump activation signal in a standby cycle in the Vpp generation circuit shown in FIG. 1.

DESCRIPTION OF THE PREFERRED EMBODIMENTS

First Embodiment

Figure 1:
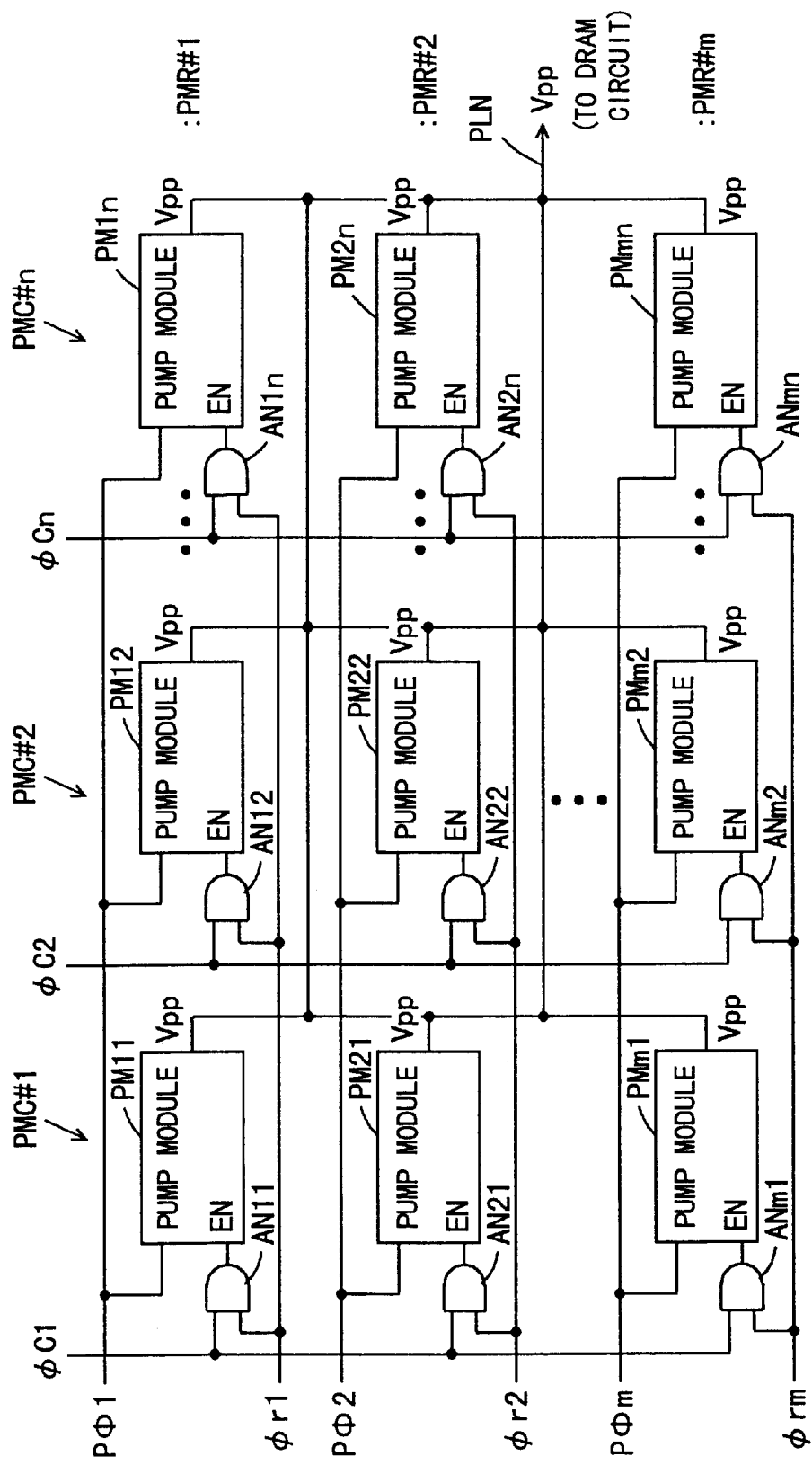
FIG. 1 schematically shows a configuration of a Vpp generation circuit according to a first embodiment of the present invention.

FIG. 1 schematically shows a configuration of a Vpp generation circuit according to a first embodiment of the present invention. In FIG. 1, the Vpp generation circuit includes a plurality of pump modules PM11–PMmn arranged in a matrix of rows and columns. Pump modules PM11–PMmn are identical in configuration and pumping capability with each other. Pump modules PM11–PMmn each include one or more charge pump circuits. In FIG. 1, pump modules aligned in a direction of a row configure a pump row block, and there are arranged pump row blocks PMR#1–PMR#m.

In addition, pump modules aligned in a direction of a column configure a pump column block PMC#, and pump column blocks PMC#1–PMC#n are arranged.

Pump row blocks PMR#1–PMR#m receive pump clock signals PΦ1–PΦm which are m-phase clock signals different in phase from each other. Pump modules PMj1–PMjn included in one pump row block PMR#j (j=1−m) commonly receive a pump clock signal PΦj.

Furthermore, pump activation signals φr1–φrm are applied to activate the respective pump row blocks PMR#1–PMR#m and pump column blocks PMC#1–PMC#n receive pump activation signals φc1–φcn for activation thereof.

Pump modules PMC11–PMCmn are provided with AND circuits AN11–ANmn, respectively. AND circuits AN11–ANmn each activate a corresponding pump module in response to a pump activation signal applied to a corresponding pump row block and a pump activation signal applied to a corresponding pump column block. For example, pump module PMij is provided at an enable input with AND circuit ANij receiving pump activation signals φri and φcj and outputting a signal which in turn is applied to the corresponding pump module PMij at an enable input EN. Pump modules PM11–PMmn have their output nodes commonly coupled with a boosted voltage transmission line PLN. A voltage Vpp on boosted voltage transmission line PLN is applied to a Vpp consumption circuit, such as a row decoder and a word line drive circuit of a DRAM circuit.

FIG. 2 shows one example of a state of each pump activation signal of a Vpp generation circuit in a standby cycle. As shown in FIG. 2, in the standby cycle, pump activation signals φr1–φrm for pump row blocks PMR#1–PMR#m are all set high, while for pump column blocks PMC#1–PMC#n the pump activation signal φc1 is set high and the remaining pump activation signals φc2–φcn are all set low. In this state, pump modules PM11–PMm1 included in pump column block PMC#1 have their respective enable inputs ENs receiving a signal of an active state, and perform a pumping operation to generate boosted voltage Vpp. The remaining pump modules PM12–PMm2 to PM1n–PMmn are all in an inactive state. Therefore, in this state, with a low current consumption, boosted voltage Vpp is generated, to compensate for boosted voltage Vpp dropping due to leak current or the like.

Figure 3:
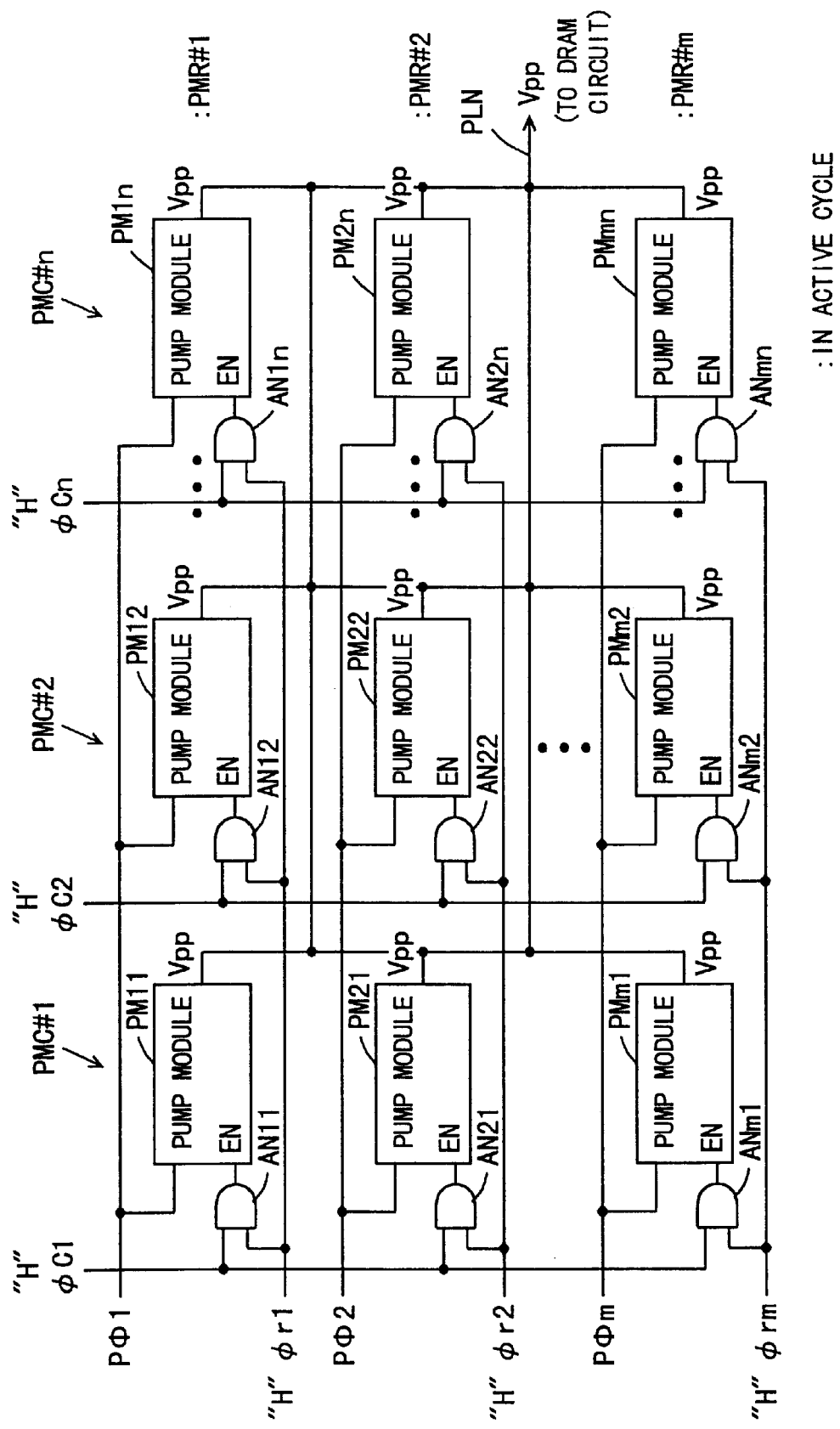
FIG. 3 represents a logic level of each pump activation signal in an active cycle in the Vpp generation circuit shown in FIG. 1.

FIG. 3 shows an example of a state of a pump activation signal of the Vpp generation circuit in an active cycle. In the active cycle, as shown in FIG. 3, pump activation signals φr1–φrm and φc1–φcn are all set high. In this case, AND circuits AN11–ANmn all output a high level signal and pump modules PM11–PMmn are all activated to perform a pumping operation to generate boosted voltage Vpp. Thus, when the DRAM circuit operates and boosted voltage Vpp on boosted voltage transmission line PLN is consumed in the active cycle, a large number of pump modules PM11–PMmn all operate to enable compensation for boosted voltage Vpp dropping in voltage level, to supply a stable boosted voltage Vpp to the DRAM circuit.

In this Vpp generation circuit, a pump module operating in the standby cycle also operates in the active cycle. This operation can eliminate the necessity of separately providing an active Vpp generation circuit for the active cycle and a standby Vpp generation circuit for the standby cycle, as is done conventionally. Thus, there can be advantageously provided a Vpp generation circuit occupying a small area.

Furthermore, if a DRAM circuit has a reduced storage capacity and the Vpp generating circuit has a current driving capability of a smaller specification value, for example, selective fixing of pump activation signals φr1–φrm and φc1–φcn to a low level allows the Vpp generation circuit to have a reduced pumping capability to be adapted to the reduced storage capacity of the DRAM, flexibly accommodating a change in a specification such as storage capacity. This layout change will be described later in detail.

[Configuration of Pump Activation Signal Generation Portion]

Figure 4:
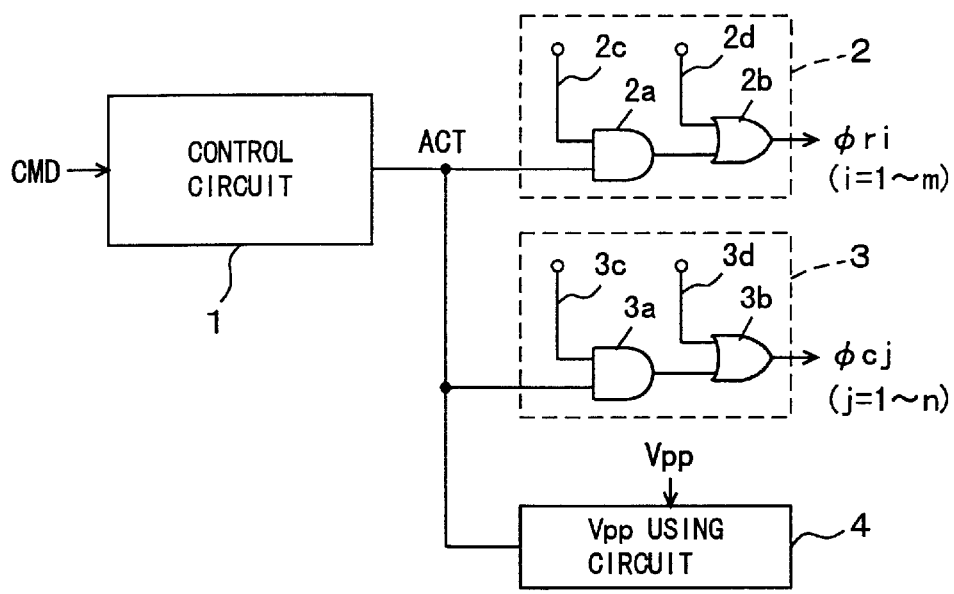
FIG. 4 schematically shows a configuration of a portion of generating a pump activation signal for the Vpp generation circuit.

FIG. 4 shows one example of a configuration of a pump activation signal generation portion. As shown in FIG. 4, the pump activation signal generating portion includes a pump row block control circuit 2 for generating a pump activation signal φri (i=1−m) for a pump row block in response to an internal operation activation signal ACT received from control circuit 1, and a pump column block control circuit 3 for generating a pump activation signal φcj (j=1−n) for a pump column block in response to internal operation activation signal ACT received from control circuit 1.

Internal operation activation signal ACT is applied to a Vpp using circuit 4 using boosted voltage Vpp for operation when internal operation activation signal ACT is activated. Internal operation activation signal ACT is, for example, an array activation signal activating an operation of selecting a memory cell row in a DRAM circuit, and when array activation signal ACT is activated, row-related circuitry operates. Therefore, Vpp using circuit 4 includes a row decoder/word line drive circuit included in this row-related circuitry. Control circuit 1 selectively activates internal operation activation signal ACT in response to an operation mode instruction signal (command) CMD externally applied and instructing a mode of operation.

Pump row block control circuit 2 includes an AND circuit 2a receiving internal operation activation signal ACT and a signal (voltage) on a line 2c, and an OR circuit 2b receiving a signal output from AND circuit 2a and a signal (voltage) on a line 2d and generating pump activation signal φri for pump row block PMR#i. Lines 2c and 2d are selectively coupled with a ground node or a power supply node. More specifically, lines 2c and 2d have their connections determined with a mask interconnection line in a manufacturing process. If line 2c is connected to the power supply node and line 2d is connected to a ground node, then pump activation signal φri changes in response to internal operation activation signal ACT. If line 2d is connected to a power supply node, then pump activation signal φri is fixed high. If lines 2c and 2d are both coupled with a ground node, then pump activation signal φri is fixed low. Therefore, pump activation signal φri can have a state set depending on a connection node of lines 2c and 2d.

Pump column block control circuit 3, similar to pump row block control circuit 2, includes an AND circuit 3a receiving internal operation activation signal ACT and a signal (voltage) on a line 3c, and an OR circuit 3b receiving a signal output from AND circuit 3a and a signal (voltage) on a line 3d and generating a pump activation signal φcj for pump column block PMC#j. In pump column block control circuit 3 as well, a connection destination node of lines 3c and 3d determines a state of pump activation signal φcj. More specifically, if lines 3c and 3d are both connected to a ground node, then pump activation signal φcj is fixed low. If line 3d is connected to a power supply node, then pump activation signal φcj is fixed high. If line 3c is connected to a power supply node and line 3d is connected to a ground node, then pump activation signal φcj is selectively activated in response to internal operation activation signal ACT. Therefore, a pump activation signal for a pump module normally operating (or operating in the standby cycle) and that operating only in the active cycle can be set in state in accordance with a connection destination node of the lines.

Figure 5:
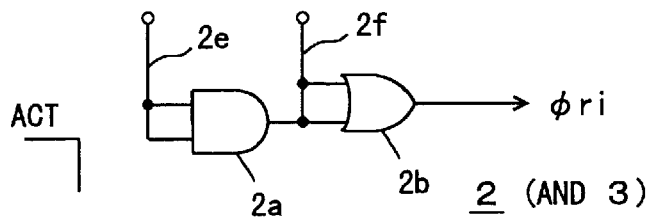
FIG. 5 shows another example of an interconnection program for a pump activation signal generating portion as shown in FIG. 4.

FIG. 5 shows an example of a modification of pump row block control circuit 2 as shown in FIG. 4. In the configuration shown in FIG. 5, pump row block control circuit 2 is similar in configuration to the circuit of FIG. 4, and includes AND circuit 2a and OR circuit 2b. If pump activation signal φri is fixed high or low, AND circuit 2a and OR circuit 2b each have the input nodes both coupled with a common node. If pump activation signal φri is to be fixed high, the lines 2e and 2f are both coupled with a power supply node. If pump activation signal φri is to be fixed low, the lines 2e and 2f are both connected to a ground node. In either case, AND circuit 2a does not receive internal operation activation signal ACT. Therefore, if the state of this pump activation signal φri is to be fixed, the internal operation activation signal ACT is isolated from the pump activation signal generation portion to alleviate the load imposed on that portion of control circuit 1 generating internal operation activation signal ACT.

While as shown in FIG. 4, control circuits 2 and 3 employ an AND circuit and an OR circuit, control circuits 2 and 3 may alternatively be configured of an NAND circuit and an NOR circuit.

Figure 6:
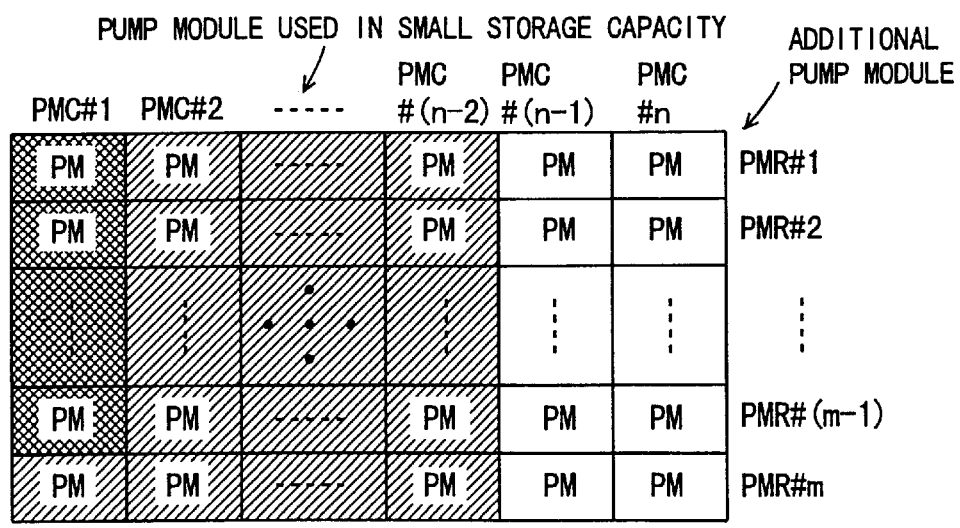
FIG. 6 schematically shows a layout of a Vpp generation circuit in a first embodiment according to the present invention.

FIG. 6 schematically shows an example of an arrangement when a Vpp generation circuit has a reduced current supplying capability. As shown in FIG. 6, the Vpp generation circuit includes pump modules PM divided into pump row blocks PMR#1–PMR#m and pump column blocks PMC#1–PMC#n. If a DRAM with the. pump modules PMs of pump row blocks PMR#1–PMR#m and pump column blocks PMC#1–PMC#n all in use is reduced in storage capacity, the pump modules, for example, of pump column blocks PMC#(n−1) and PMC#n are all fixed to an inactive state. In the standby state, the pump modules PMs that are arranged corresponding to an intersection of pump column block PMC#1 and pump row blocks PMR#1–PMR#(m−1) are activated. Thus, if DRAM is to be reduced in storage capacity, the Vpp generation circuit can have its charge supplying capability readily reduced correspondingly. If an increased current supplying capability is desired, a pump column block is additionally arranged. It should be noted that, as will be described in detail later, it is not necessary to lay out a pump module normally inactivated. Only a pump module that is used is laid out.

The pump control circuit may be configured utilizing the configuration as shown in FIG. 4, and a mask interconnection line formed in an interconnection process determines activation/inactivation of a pump module.

With a plurality of pump modules provided for each of pump clock signals PΦ1–PΦm of multiple phases, if each DRAM is increased or decreased in storage capacity or current driving capability, the number of pump modules activated for each pump clock signal is modified. Thus, a multi-phase clock signal can be used to increase or reduce a current supplying capability to reliably generate boosted voltage Vpp.

In the arrangement as described above, the pump modules are arranged in rows and columns and control of activation/inactivation of the pump modules are made by the row block control circuit and the column block control circuit. Therefore, each pump module receive the pump activation signals in both the row and column directions. However, the pump modules may be controlled of activation/inactivation in a pump row block unit or in a pump column block unit singly. In such a pump block unit control, the activation signal lines are merely required to be arranged along the pump block. Of course, even in such an arrangement the activation signal lines may be arranged in the hierarchical arrangement with the global lines coupled to the corresponding control circuit and the local lines coupled to corresponding pump modules.

As described above, in accordance with the first embodiment of the present invention, a plurality of pump modules are provided in a circuit for generating boosted voltage Vpp, and depending on the specification value such as storage capacity, power supply voltage and the like, the pump modules are selectively activated by an activation signal. As a result, a Vpp generation circuit having an optimal current supplying capability can be provided without introducing a change in its design. Furthermore, a pump module operating in the standby cycle can also be used in the active cycle, which eliminates the necessity of separately providing a Vpp generation circuit for the active cycle and that for the standby cycle. Therefore, there can be provided a Vpp generation circuit occupying a reduced area. It should be noted that if an external power supply voltage has a reduced specification value, the Vpp generation circuit would be subject to a specification change, the contents of which vary depending on whether there is a change introduced into a specification of a boosted voltage used in the DRAM.

Second Embodiment

Figure 7:
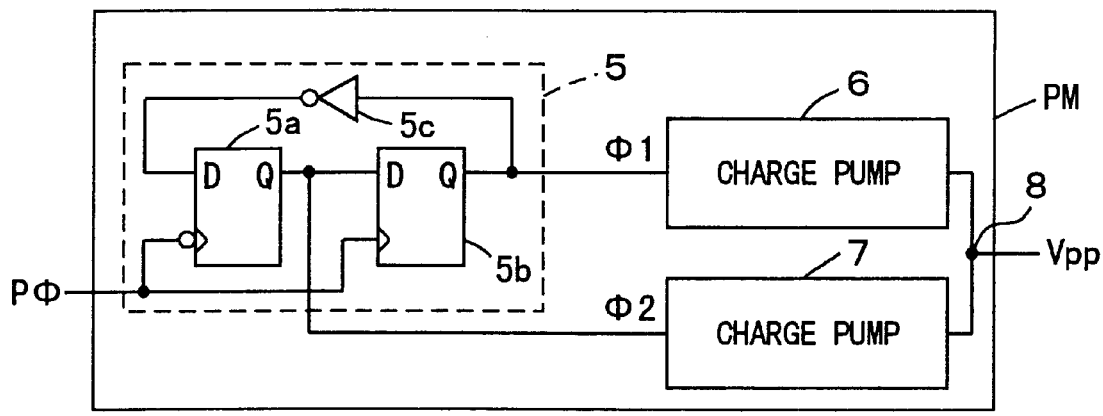
FIG. 7 schematically shows a configuration of a pump module according to a second embodiment of the present invention.

FIG. 7 schematically shows a configuration of a pump module according to a second embodiment of the present invention. Referring to FIG. 7, a pump module PM includes a divider circuit 5 for frequency-dividing a pump clock signal PΦ to generate frequency-divided clock signals Φ1 and Φ2 of two phases, and charge pumps 6 and 7 responsive to frequency-divided clock signals φ1 and φ2, respectively, received from divider circuit 5 for performing a charge pump operation to supply electric charge to an output node 8.

Divider circuit 5 includes D flip flops 5a and 5b cascaded in two stages, and an inverter 5c receiving frequency-divided clock signal φ1 from an output Q of D flip flop 5b and inverting and transmitting the frequency-divided clock signal φ1 to D flip flop 5a at an input D. D flip flop 5a is responsive to a high to low transition of pump clock signal PΦ to latch and output a signal outputted from inverter 5c, while D flip flop 5b is responsive to a low to high transition of pump clock signal PΦ to take thereinto and output frequency-divided clock signal Φ2 outputted from D flip flop 5a.

Figure 8:
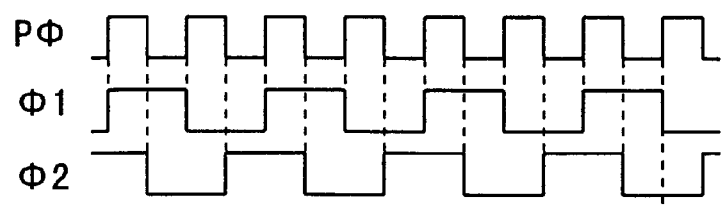
FIG. 8 is a signal waveform diagram representing an operation of a divider circuit of the pump module shown in FIG. 7.

Therefore, as shown in FIG. 8, frequency-divided clock signal Φ2 transitions in state in response to a high to low transition of pump clock signal Φ, while frequency-divided clock signal Φ1 transitions in state in response to a low to high transition of pump clock signal PΦ. Charge pumps 6 and 7 are responsive to frequency-divided dock signals Φ1 and Φ2, respectively, to perform a charge pump operation to supply electric charge to output node 8. Charge pumps 6 and 7 each perform a charge pump operation at different timings to allow the boosted voltage Vpp at output node 8 to be reduced in amplitude and also to reliably generate boosted voltage Vpp.

It should be noted that, as shown in FIG. 8, frequency-divided clock signals Φ1 and Φ2 transition with a period twice the period of pump clock signal PΦ. Therefore, this pump module PM has a pumping capability similar to that provided when a single charge pump operates in response to pump clock signal PΦ. A pump has a charge supplying capability in proportion to the product of a frequency of a pump clock signal and a capacitance value of a capacitor used for a charge pump.

Using divider circuit 5 to frequency-divide pump clock signal PΦ in pump module PM to generate frequency-divided clock signals of two phases, can reduce the number of pump clock signals provided from outside the group of pump modules, and hence the area occupied by a pump clock signal line. Furthermore, a fast clock signal such as an external clock signal can be used to operate a pump module. For an embedded DRAM, data is input/output in synchronization with a clock signal such as a system dock.

Modification

Figure 9:
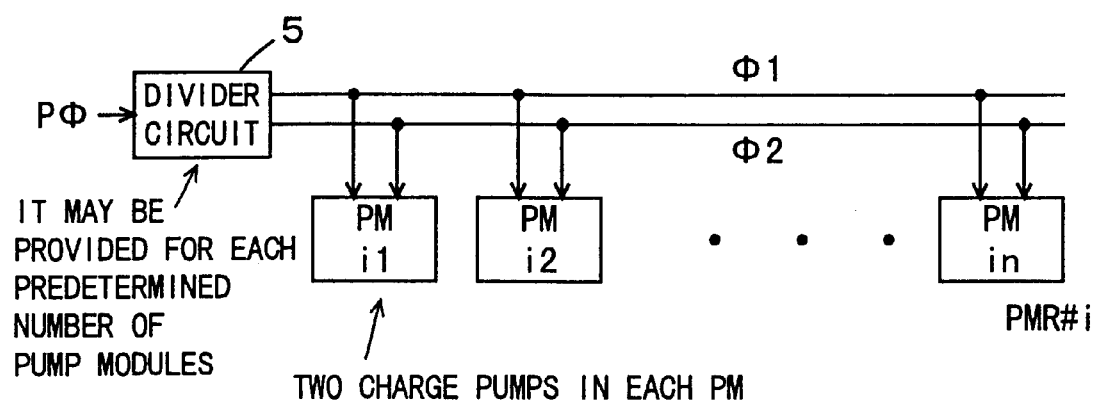
FIG. 9 shows a first modification of the second embodiment of the present invention.

FIG. 9 schematically shows a modification of the second embodiment of the present invention. FIG. 9 shows a configuration for a pump row block PMR#i formed of pump modules PMi1–PMin provided commonly with divider circuit 5. Pump modules PMi1–PMin each include two charge pumps and perform a charge pump operation in response to frequency-divided clock signals Φ1 and Φ2 of two phases. In the configuration of FIG. 9, divider circuit 5 is provided for each pump row block PMR#1 (i=1–m). Pump modules PMi1–PMin can dispense with an internal divider circuit and the area occupied by a pump module can be reduced.

It should be noted that divider circuit 5 may be provided for each predetermined number of pump modules in a pump row block PMR#i In this arrangement, one divider circuit is responsible for a reduced number of charge pumps, and a load imposed thereon can be alleviated. Thus, an accurate clock waveform can be transmitted and the divider circuit can also be reduced in scale.

Second Modification

Figure 10:
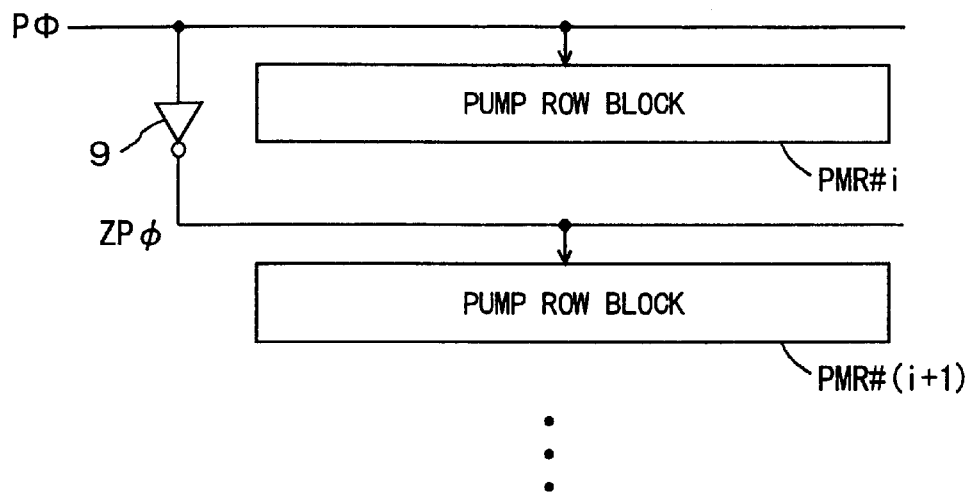
FIG. 10 shows a second modification of the second embodiment of the present invention.

FIG. 10 schematically shows a configuration of a second modification of the second embodiment according to the present invention. In FIG. 10, pump clock signal PΦ is applied commonly to the pump modules included in pump row block PMR#i, while pump clock signal PΦ is inverted by an inverter 9 and an inverted pump clock signal ZPΦ is applied to the pump modules included in pump row block PMR#(i+1). Pump clock signals PΦ and ZPΦ are out of phase from each other by 180°. The configuration shown in FIG. 10 can also reduce the number of signal lines transmitting a pump clock signal applied to a group of pump modules.

It should also be noted that in the configuration shown in FIG. 10, two charge pumps may be included in a pump module, as shown in FIG. 7, driven by pump clock signal PΦ and pump clock signal ZPΦ complementary thereto, respectively.

Furthermore, divider circuit 5 shown in FIG. 9 may be replaced by inverter 9 to generate pump clock signals PΦ and ZPΦ of two phases out of phase by 180° for application to pump modules PMi1–PMin of pump row block PMR#i.

Furthermore, pump clock signal PΦ may be frequency-divided by a divider circuit and a resultant frequency-divided clock signal may be inverted by inverter 9 to generate non-overlapping, two phase frequency-divided clock signals for application to two charge pumps.

Still furthermore, divider circuit 5 shown in FIG. 9 may be configured to generate clock signals of four phases distributed to four pump row blocks, respectively. Generally, an M divider circuit may be employed to divide pump clock signal PΦ to generate M frequency-divided clock signals distributed to pump row blocks PMR#1–PMR#m, with M/m being an integer.

A divider circuit (including an inverter) arranged in a vicinity of a group of pump modules can reduce the number of pump clock signal lines, reducing the area occupied by the signal lines and the current charging and discharging the pump clock signal lines.

Yet furthermore, a divider circuit may be replaced simply by a phase shift circuit.

It should be noted that in FIG. 7, enable input EN is not shown in pump module PM. A signal received at enable input EN controls a charge pump operation of charge pumps 6 and 7 or prohibits pump clock signal Pm from being transmitted to divider circuit 5.

Third Embodiment

Figure 11:
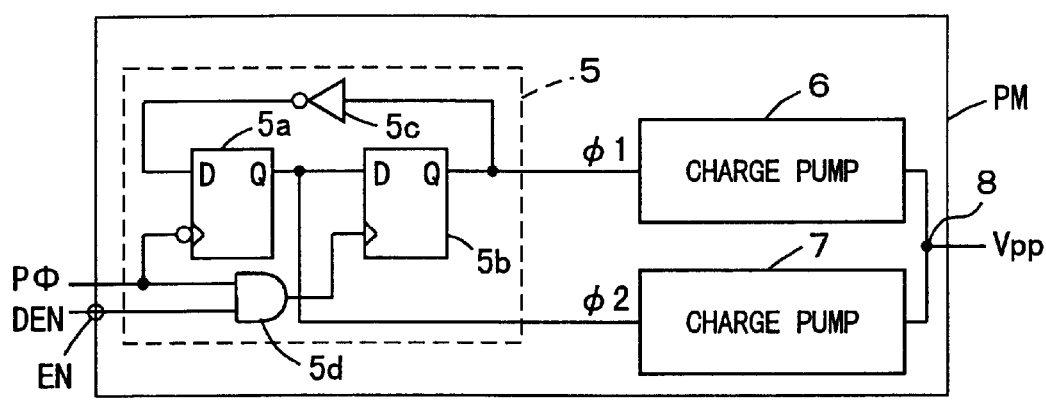
FIG. 11 schematically shows a configuration of a pump module according to a third embodiment of the present invention.

FIG. 11 schematically shows a configuration of pump module PM according to a third embodiment of the present invention. Referring to FIG. 11, pump module PM includes divider circuit 5 frequency-dividing pump clock signal PΦ by two to provide frequency-divided clock signals Φ1 and Φ2 of two phases, and charge pumps 6 and 7 perform a charge pump operation in response to frequency-divided clock signals Φ1 and Φ2, respectively.

Figure 12:
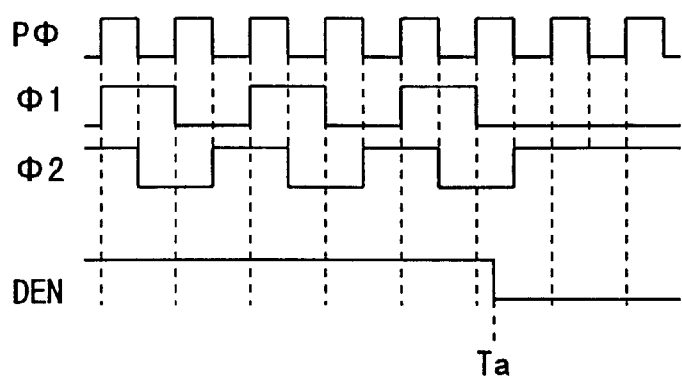
FIG. 12 is a signal waveform diagram representing an operation of a divider circuit of the pump module shown in FIG. 11.

While the enable input EN is not specifically described with reference to the second embodiment, the third embodiment provides divider circuit 5 including AND circuit 5d receiving an activation signal DEN inputted via enable input EN and pump clock signal PΦ. AND circuit 5d outputs a signal which in turn is input to D flip flop 5b at a clock input. Now, the operation of divider circuit 15 shown in FIG. 11 will be described with reference to the signal waveform diagram shown in FIG. 12.

When activation signal DEN is at a high level, AND circuit 5d outputs a signal transitioning in response to pump clock signal PΦ. Therefore, in this state, divider circuit 5 performs a frequency-dividing operation to frequency-divide pump clock signal PΦ by two to generate frequency-divided clock signals Φ1 and Φ2. It is now considered where pump clock signal PΦ transitioning from low to high level is immediately followed by activation signal DEN transitioning from high to low level at a time Ta. In response to pump clock signal PΦ transitioning from low to high level immediately before time Ta, a signal outputted from AND circuit 5d goes high and D flip flop 5b performs a latch operation and the output signal thereof has its state varying in response to frequency-divided clock signal φ2.

When activation signal DEN falls low at time Ta, D flip flop 5b still remains latching and the output signal thereof does not change in state. Subsequently when pump clock signal PΦ transitions from high to low level, D flip flop 5a takes in and outputs a signal outputted from inverter 5c. In this state, frequency-divided clock signal Φ1 has the low level and D flip flop 5a outputs frequency-divided clock signal Φ2 going high. If pump clock signal PΦ subsequently goes high, AND circuit 5d outputs a signal having the low level and frequency-divided clock signal Φ1 remains low. Thereafter, for activation signal DEN held low, frequency-divided clock signal Φ remains low and frequency-divided clock signals Φ2 remains high.

Therefore, if activation signal DEN is activated as timed to immediately follow pump clock signal PΦ transitioning from low to high level, charge pumps 6 and 7 can receive a frequency-divided clock signal having an accurate waveform. This can prevent a clock signal like a whisker-like noise from causing charge pumps 6 and 7 to provide an unreliable pump operation and operate erroneously.

The configuration shown in FIG. 11 is also applicable to the configuration shown in FIG. 9.

Furthermore, in the configuration shown in the FIG. 11, such a configuration may be employed that a NAND circuit receiving pump clock signal PΦ and activation signal DE outputs a signal which in turn is input to D flip flop 5a at a clock input and the signal outputted from the NAND circuit is inverted to be input to D flip flop 5b at a clock input.

Thus, according to the third embodiment, when a pump module is activated/inactivated, a divider circuit generating a frequency-divided clock signal is activated/inactivated and a charge pump can be prevented from receiving a signal having a short pulse width. Thus, there can be provided an accurate charge pump operation.

Fourth Embodiment

Figure 13:
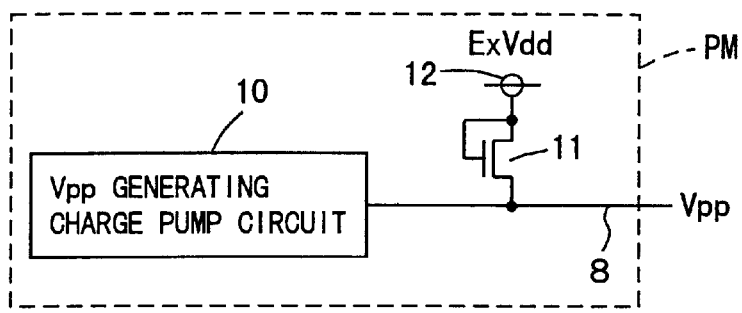
FIG. 13 schematically shows a configuration of a main portion of a pump module according to a fourth embodiment of the present invention.

FIG. 13 schematically shows a configuration of a pump module according to a fourth embodiment of the present invention. Referring to FIG. 13, pump module PM includes a Vpp generating charge pump circuit 10 generating boosted voltage Vpp, and an n-channel MOS transistor 11 connected between output node 8 and an external power supply node 12. MOS transistor 11 has a gate also connected to external power supply node 12. Vpp generating charge pump circuit 10 may include the charge pumps provided for the divider circuit and/or the respective frequency-divided clock signals, as shown in the configuration of the third embodiment. It may alternatively be provided simply with charge pumps.

MOS transistor 11 charges output node 8 when external power supply voltage ExVdd rises while boosted voltage Vpp is at a low voltage level upon power-on. More specifically, MOS transistor 11 functions to assist an initial charging when boosted voltage Vpp is generated.

It is a load of the Vpp generation circuit that determines a current supplying capability that an initial-charge assisting circuit is required to have in this Vpp generation circuit. The Vpp generation circuit has a current supplying capability determined by this load. In the present invention, a Vpp generation circuit has a current supplying capability in proportion to the number of pump modules used according to the load of interest. Therefore, when pump module PM is internally provided with MOS transistor 11 as an initial-charge assisting circuit, as shown in FIG. 13, increasing/decreasing the number of pump modules PMs used according to the load of the Vpp generation circuit can naturally adjust the current supplying capability of the initial-charge assisting circuit. Therefore, there is no need of redesigning the initial-charge assisting circuit with the application of interest of the DRAM taken into account, and an initial-charge assisting circuit with an optimized current driving capability can be readily implemented.

Modification

Figure 14:
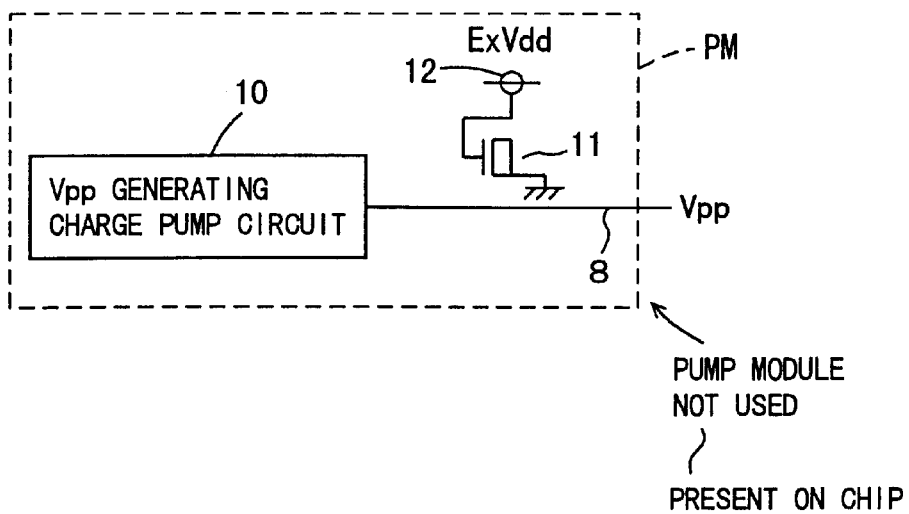
FIG. 14 schematically shows a configuration of the pump module according to the fourth embodiment of the present invention when it is not used.

FIG. 14 shows a modification of a fourth embodiment according to the present invention. FIG. 14 shows a state that even if pump module PM is not in use, it still is arranged internal to a Vpp generation circuit of a DRAM. To optimize a current driving capability and a layout area, a pump module not to be used is not manufactured and the number of pump modules is adjusted according to each application. If a common layout accommodates different specifications, however, a pump module is fabricated and a pump module not to be used is interconnected into a non-used state. In this case, MOS transistor 11 provided as an initial-charge assisting circuit has a source and drain node connected to a ground node and used as an MOS capacitor. Therefore, a stabilizing capacitance can be attached to external power supply node 12 to stabilize external power supply voltage ExVdd.

It should be noted that if a logic and a DRAM are mounted on a common semiconductor chip as in an embedded DRAM, there are provided a minimal required number of pump modules PMs in DRAM macro, with the current supplying capability required for the Vpp generation circuit taken into consideration. This current supplying capability is adjusted by increasing/decreasing the number of pump modules in a pump row block.

As described above, according to the fourth embodiment, a pump module is internally provided with a MOS transistor for assisting initial charging and a Vpp generation circuit has a current supplying capability determined by the number of pump modules, and accordingly a current supplying capability of the initial-charge assisting circuit required for the Vpp generation circuit is automatically determined, eliminating the necessity of redesigning the initial-charge assisting circuit.

It should be noted that in the initial-charge assisting circuit the n-channel MOS transistor may be replaced by a p-channel MOS transistor.

Fifth Embodiment

Figure 15:
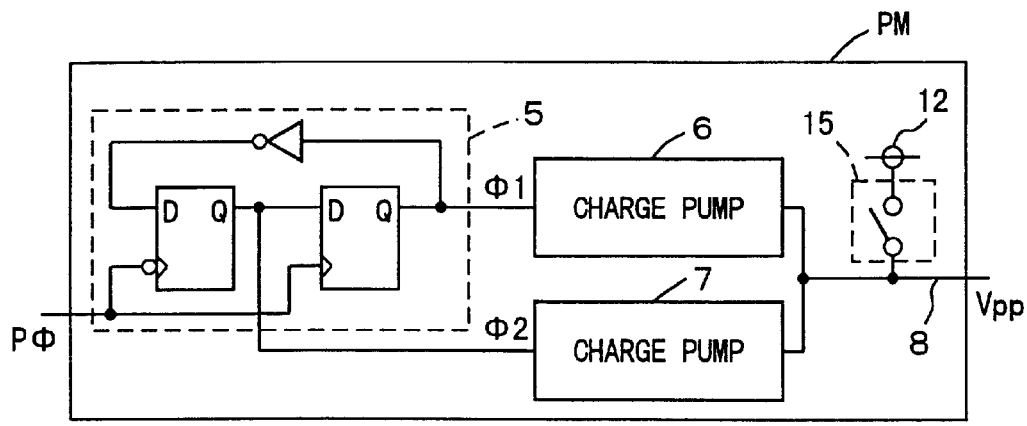
FIG. 15 schematically shows a configuration of a pump module according to a fifth embodiment of the present invention.

FIG. 15 schematically shows a configuration of pump module PM according to a fifth embodiment of the present invention. Referring to FIG. 15, pump module PM, similar in configuration to that shown in FIG. 7, includes divider circuit 5 and charge pumps 6 and 7 performing a charge pump operation in response to frequency-divided clock signals $\Phi 1$ and $\Phi 2$ received from divider circuit 5. Pump module PM further includes a switching circuit 15 connected between external power supply node 12 and output node 8. Switching circuit 15, shown as a mechanical switch in FIG. 15, is used for the following purpose. To estimate an internal circuit even when boosted voltage Vpp is defective in level, an external power supply voltage is transmitted on this boosted voltage transmission line to operate the internal circuit for determining whether the internal circuit is defective or not defective.

Switching circuit 15 for directly coupling the external power supply node is also required to have a current driving capability set with the current driving capability of the Vpp generation circuit taken into consideration. More specifically, to operate an internal circuit with an external power supply voltage in stead of a boosted voltage, the circuit (switch circuit 15) directly coupling the external power supply is required to have a current driving capability equivalent to that of the Vpp generation circuit. With pump module PM provided with switching circuit 15 for directly coupling the external power supply node, the Vpp generation circuit has a current driving capability determined by the number of pump modules PMs in use. The number of switching circuits 15 is equal to that of pump modules PMs in use and switching circuits 15 accordingly can have a current supplying capability set depending on the current driving capability of pump module PM. More specifically, the circuit directly coupling the external power supply can have a current driving capability automatically set according to the current driving capability of the Vpp generation circuit. Therefore, changing of a current supplying capability of the Vpp generation circuit depending on the application of interest entails the changed number of pump modules to be used (activated), and accordingly adjusting the number of switching circuits 5 is accompanied by automatic adjustment of the current driving capability of the circuit directly coupling the external power supply, eliminating the necessity of redesigning the circuit directly coupling the external power supply for a different specification. Thus, the circuit directly coupling the external power supply node and the Vpp generation circuit can have a current supplying capability readily set to an optimal value.

Figure 16:
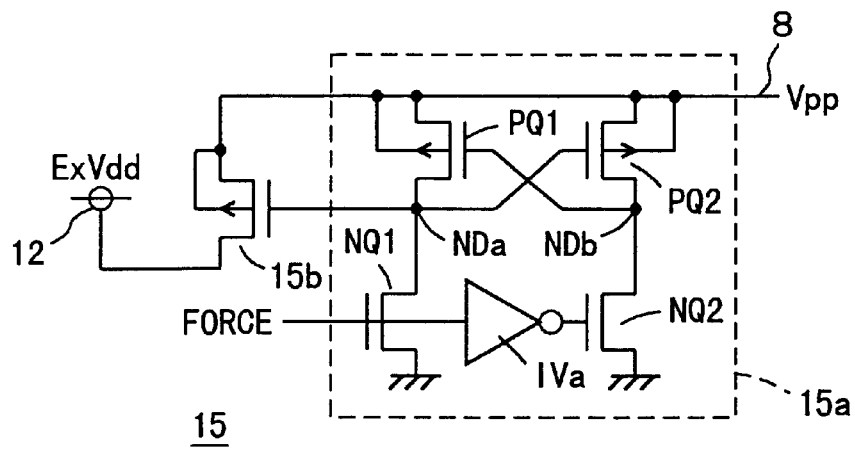
FIG. 16 shows a configuration of the switch circuit shown in FIG. 15.

FIG. 16 shows one example of a configuration of switching circuit 15 shown in FIG. 15. Referring to FIG. 16, switching circuit 15 includes a level conversion (shift) circuit 15a for converting an amplitude of a direct-coupling instruction signal FORCE into a voltage level on output node 8, and a p-channel MOS transistor 15b coupling an external power supply node 12 and output node 8 in response to a signal outputted from level conversion circuit 15a.

Level shift circuit 15a includes a p-channel MOS transistor PQ1 connected between output node 8 and a node NDa and having its gate connected to a node NDb, a p-channel MOS transistor PQ2 connected between output node 8 and node NDb and having a gate connected to node NDa, an n-channel MOS transistor NQ1 connected between node NDa and a ground node and having a gate receiving direct-coupling instruction signal FORCE, and an n-channel MOS transistor NQ2 connected between node NDb and a ground node and having a gate receiving direct-coupling instruction signal FORCE via an inverter IVa.

When direct-coupling instruction signal FORCE is at a low level, inverter IVa outputs a signal of a high level, MOS transistor NQ2 turns on and node NDb is discharged to the ground node. Responsively, p-channel MOS transistor PQ1 turns on to cause node NDa to have a voltage level set to the voltage Vpp level on output node 8. P-channel MOS transistor PQ2 turns off and finally node NDb is fixed at the ground voltage level and node NDa is fixed at the voltage Vpp level on output node 8. In this state, boosted voltage Vpp is higher in voltage level than external power supply voltage ExVdd in a normal mode of operation and p-channel MOS transistor 15b remains off.

When direct-coupling instruction signal FORCE is set high, MOS transistor NQ1 turns on and node NDa is discharged to the ground voltage level. Thus, in this state, p-channel MOS transistor 15b turns on, output node 8 is coupled with external power supply node 12 so that boosted voltage Vpp can be changed according to external power supply voltage ExVdd.

As shown in FIG. 16, by using level conversion circuit 15a to allow the use of a p-channel MOS transistor as a transistor for directly coupling an external power supply node, switching circuit 15 can occupy a reduced area, and thus a pump module can be individually, internally provided with the switching circuit. More specifically, if the switching transistor is an n-channel MOS transistor, controlling of turning on/off the switching n-channel MOS transistor requires the generation of a voltage higher than external power supply voltage ExVdd (to prevent a threshold voltage loss across the n-channel MOS transistor).

Therefore, a charge pump circuit would be required in a case of using the n-channel MOS for the switching transistor and a circuit would thus occupy an increased area, which would make it difficult to arrange a direct-coupling switching circuit internal to a pump module. Using a p-channel MOS transistor can eliminate the necessity of considering its threshold voltage loss when it conducts, and simply with level conversion, the external power supply node and the output node can readily be directly coupled or disconnected.

As described above, according to the fifth embodiment, a pump module can be internally provided with a switching transistor for directly coupling to an external power supply node, to readily implement a direct-coupling circuit having a current driving capability corresponding to a current driving capability of a Vpp generation circuit.

It should be noted that in the configuration. of FIG. 16, the direct-coupling p-channel MOS transistor, 15b has a current driving capability set with the current driving capability of a charge pump internal to a corresponding pump module taken into account.

Sixth Embodiment

Figure 17:
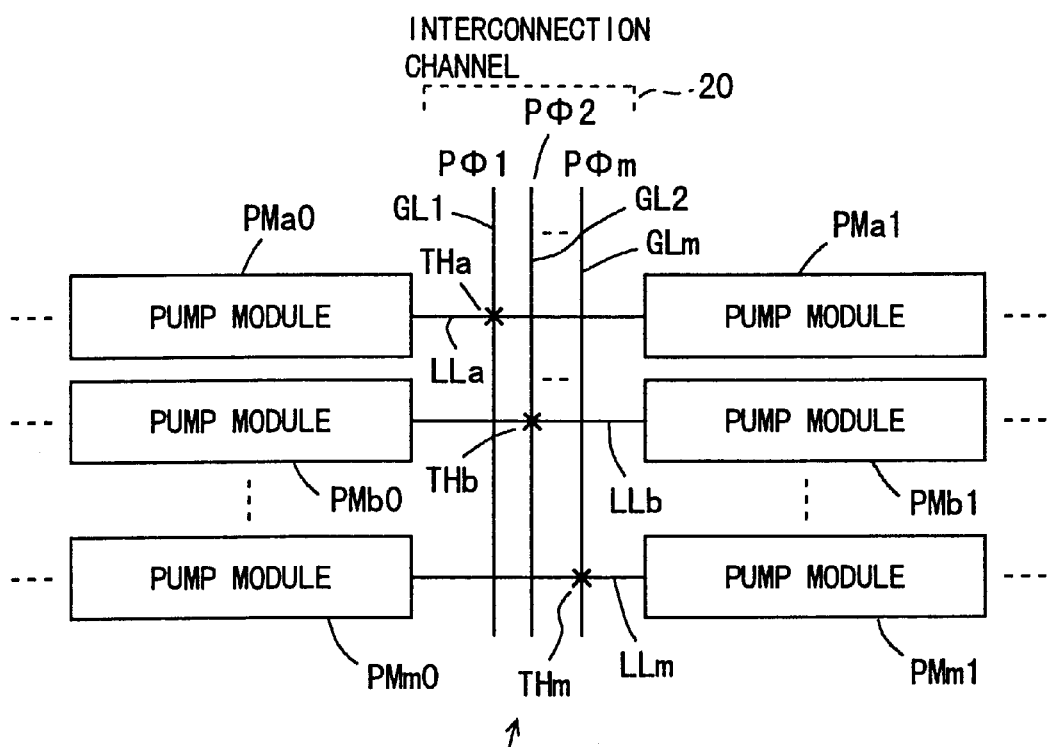
FIG. 17 schematically shows a configuration of a sixth embodiment according to the present invention.

FIG. 17 schematically shows a configuration of a main portion of a Vpp generation circuit according to a sixth embodiment of the present invention. In FIG. 17, an interconnection channel 20 extends in a vertical or longitudinal direction. On both sides of interconnection channel 20, there are arranged pump modules PMa0, PMa1, PMb0, PMb1, PMm0, PMm1 as an example. In interconnection channel 20, there are arranged global dock signal lines GL1 to GLm transmitting pump clock signals PΦ1–PΦm, respectively.

In the group of pump modules, pump modules aligned in a direction orthogonal to the direction in which interconnection channel 20 extends receive a common pump dock signal. More specifically, pump modules PMa0 and PMa1 receive a common pump clock signal, pump modules PMb0 and PMb1 similarly receive another common pump clock signal, and pump modules PMm0 and PMm1 also receive a further common pump dock signal.

In this example, local dock signal lines LLa–LLm are provided for the pump module groups or pump row blocks, respectively, and they are arranged extending in a direction orthogonal to global clock signal lines GL1–GLm. Global dock signal lines GL1–GLm and local clock signal lines LLa–LLm are connected together in interconnection channel 20 by through holes THa–THm, respectively. p In the layout of clock signal lines shown in FIG. 17, pump module groups can receive only required dock signals via the respective local clock signal lines LLa–LLm. Therefore, the configuration shown in FIG. 17 can reduce the number of clock signal lines and an area occupied by clock signal transmission lines, as compared to a configuration in which a plurality of dock signal lines are arranged for a pump module row block and a required clock signal line is selectively coupled.

Furthermore, the clock signal lines are arranged with a hierarchical configuration of global clock signal lines GL1–GLm and local clock signal lines LLa–LLm, and even clock signals reduced in number of required phases can be readily re-distributed without any change in the layout, as will be described below.

Figure 18:
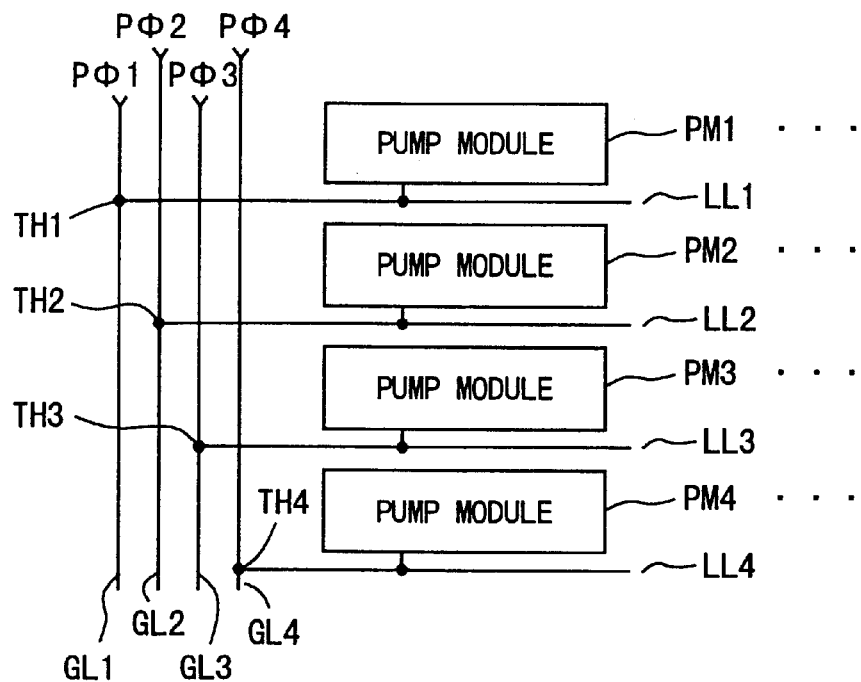
FIG. 18 shows a specific example of connecting a clock signal line in the sixth embodiment according to the present invention.

Now, as shown in FIG. 18, four pump modules PM1–PM4 are assumed to be used. In interconnection channel 20, there are arranged global clock signal lines GL1–GL4 and local clock signal lines LL1–LL4 for pump modules PM1–PM4, respectively. Global clock signal lines GL1–GL4 are coupled with local clock signal lines LL1–LL4 via through holes TH1–TH4, respectively. Pump modules PM1–PM4 receive the respective pump clock signals PΦ1–PΦ4 different in phase from each other via global clock signal lines GL1–GL4 and local clock signal lines LL1–LL4. Pump modules PM1–PM4 each simply receive only a required clock signal via a corresponding one of local clock signal lines LL1–LL4., which prevents complication of interconnection lines and reduces the area occupied by clock signal lines.

Figure 19:
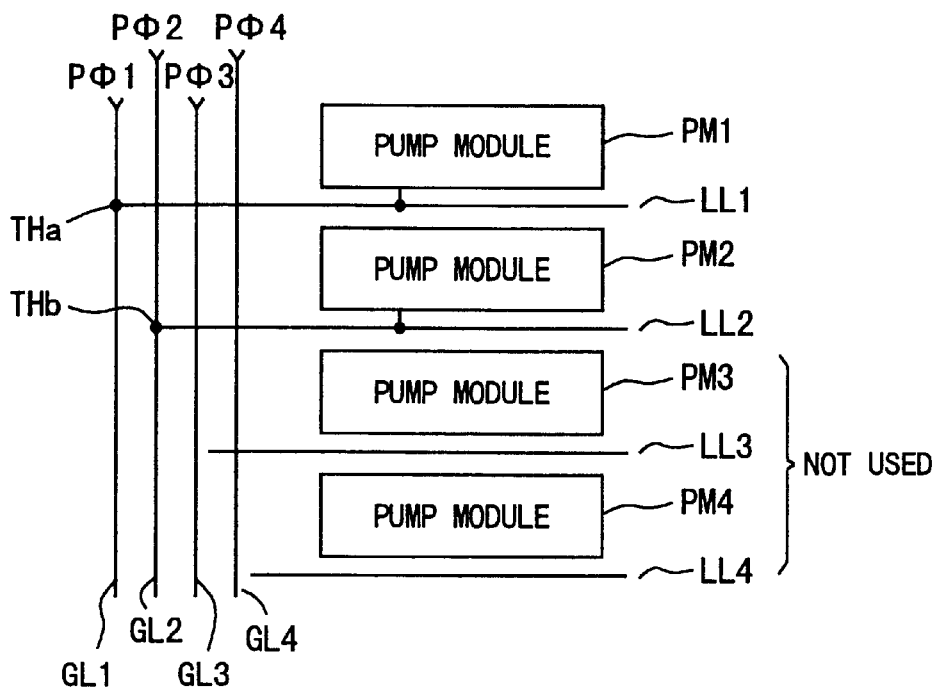
FIG. 19 schematically shows another configuration of the connection of the clock signal line in the sixth embodiment according to the present invention.

Now, it is assumed that a storage capacity is reduced and the Vpp generation circuit accordingly has a reduced current driving capability and, as shown in FIG. 19, pump modules PM1 and PM2 are used and pump modules PM3 and PM4 are not used. Pump modules PM1 and PM2 receive pump clock signals PΦ1 and PΦ3. In this example, local clock signal line LL1 is coupled with global clock signal line GL1 via through hole THa and local clock signal line LL2 and global clock signal line GL3 are coupled together via through hole THb. Neither of local clock signal lines LL3 and LL4 are connected to global clock signal lines GL3 and GL4. More specifically, through holes are not provided for these clock signal lines . In this arrangement, by simply changing a position of a through hole, a clock signal can have a changed number of phases and in addition, pump clock signals used can have a changed phase relationship.

It should be noted that the interconnection channel may be shared by all of pump column blocks, or may be provided for each predetermined number of pump column block(s). Furthermore, the interconnection channel region may be arranged on one side of a pump module arranging region.

As described above, according to the sixth embodiment, a global clock signal line is arranged into an interconnection channel and for a pump module, a local clock signal line is arranged to transmit only a required clock signal in a direction orthogonal to the global clock signal line. This arrangement can simplify an interconnection layout and calls for a minimal required number of clock signal lines to reduce the area occupied by the clock signal lines.

Seventh Embodiment

Figure 20:
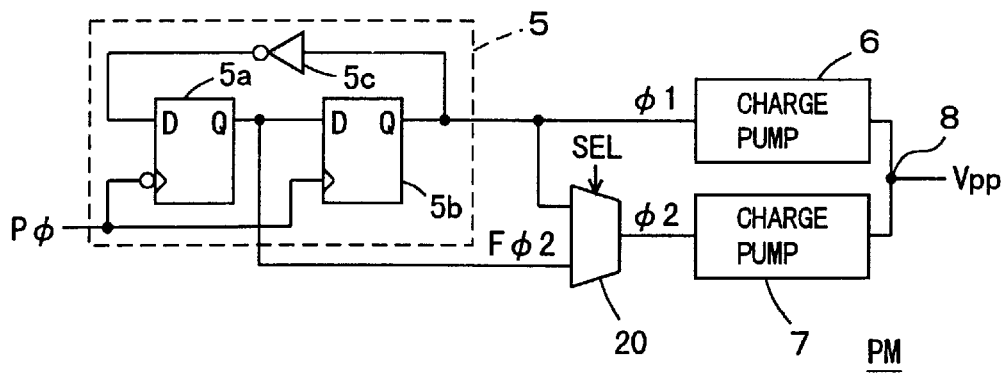
FIG. 20 shows a configuration of a pump module according to a seventh embodiment of the present invention.

FIG. 20 schematically shows a configuration of a pump module according to a seventh embodiment of the present invention. Pump module PM as shown in FIG. 20 is different from pump module PM shown in FIG. 7 in that there is provided a selector 20 responsive to a select signal SEL for selecting one of frequency-divided clock signal PΦ2 (F φ2) from D flip flop 5a of divider circuit 5 and frequency-divided clock signal PΦ1 (φ1) from D flip flop 5b of divider circuit 5 to generate and apply frequency-divided clock signal PΦ2 (φ2) to charge pump 7. The remaining of the configuration is identical to that of the pump module as shown in FIG. 7.

As shown in FIG. 20, in pump module PM, when select signal SEL is at a low level for example, selector 20 selects frequency-divided clock signal FΦ2 output from D flip flop 5a and generates and applies frequency-divided clock signal Φ2 to charge pump 7. Therefore, charge pumps 6 and 7 provide a charge pump operation in response to frequency-divided clock signals φ1 and Φ2 having different phases from each other.

When select signal SEL attains a high level for example, selector 20 selects frequency-divided clock signal Φ1 outputted from D flip flop 5b. Therefore, charge pumps 6 and 7 perform a charge pump operation in response to the same frequency-divided clock signal Φ1.

More specifically, in one pump module PM, a clock signal of two phases or a clock signal of a single phase is applied to provide a charge pump operation. In this way, the number of phrases of the clock signal for the pump operation is altered.

In a configuration as shown in FIG. 18, when pump modules PM1–PM4 each include two charge pumps for example, internal to each of pump modules PM1–PM4 a single pump clock signal is applied to operate two charge pumps. Thus, pump modules PM1–PM4 can provide a 4-phase charge pump operation. Furthermore, in the configuration as shown in FIG. 19, when pump modules PM1 and PM2 each include two charge pumps, pump modules PM1 and PM2 each have the two charge pumps receiving frequency-divided clock signals having different phases. Thus, pump modules PM1 and PM2 can provide a 4-phase charge pump operation.

It should be noted that divider circuit 5 and the selector 20 may be provided for each predetermined number of pump modules, as shown in FIG. 9. Furthermore, divider circuit 5 may be replaced by an inverter, as shown in FIG. 10.

As described above, according to the seventh embodiment, when a pump module includes a plurality of charge pumps, the pump module is configured such that a select signal can reduce the number of phases of pump clock signals applied to the plurality of charge pumps, and thus the number of pump modules in a Vpp generation circuit can be changed appropriately depending on the number of available phases of the clock signals. Even if the number of pump modules is smaller than that of available phases of the clock signals, therefore, the number of the phases of the clock signals can readily be reduced.

Furthermore, when a storage capacity is changed and the number of the phases of pump clock signals is accordingly changed, the modification of pump clock signal generation circuitry for a Vpp generation circuit can be suppressed to the minimal extent.

Eighth Embodiment

Figure 21A:
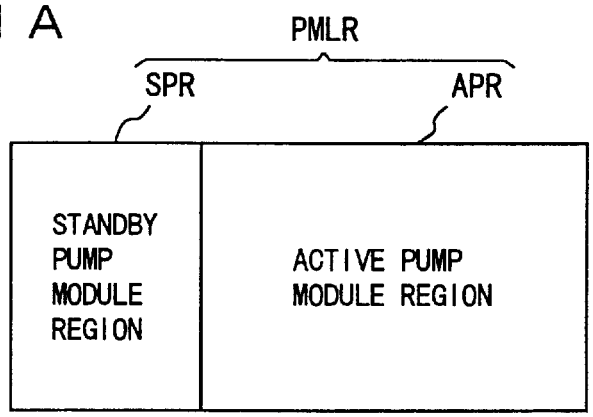
FIGS. 21A–21C schematically show adjustment of a pump module arranging region of a Vpp generation circuit in an eighth embodiment according to the present invention.

Referring to FIG. 21A, a pump module arranging region PMLR includes a standby pump module region SPR having arranged therein a pump module (normally) operating in a standby cycle, and an active pump region APR having arranged therein an active pump module operating in an active cycle. The pump modules arranged in pump module arranging region PMLR are all used and activated/inactivated depending on a mode of operation. In this pump module arranging region PMLR, a pump module is laid out. The pump modules arranged in pump module arranging region PMLR implement a Vpp generation circuit optimal for a certain specification value.

Figure 21B:
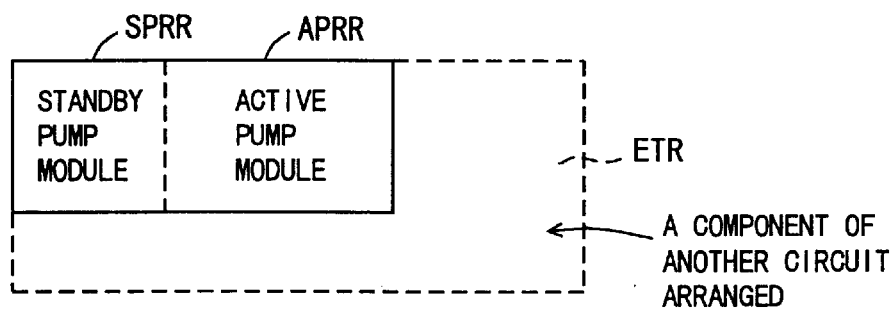

When a storage capacity is reduced and a Vpp generation circuit has a reduced current driving capability, the Vpp generation circuit is configured, as shown in FIG. 21B, of a pump module arranged in a standby pump module region SPRR and a pump module arranged in an active pump module region APRR. Standby pump module region SPRR and active pump module region APRR are smaller in area or smaller in number of pump modules than the standby pump module region SPR and active pump module region APR, respectively. A remaining region ETR does not have any pump module arranged therein. Rather, the region ETR has a component of another circuit, such as a transistor, arranged therein. Thus, an area can be used more efficiently.

The pump modules are simply reduced in number, which can eliminate the necessity of redesigning and readily accommodate a change of a specification.

Figure 21C:
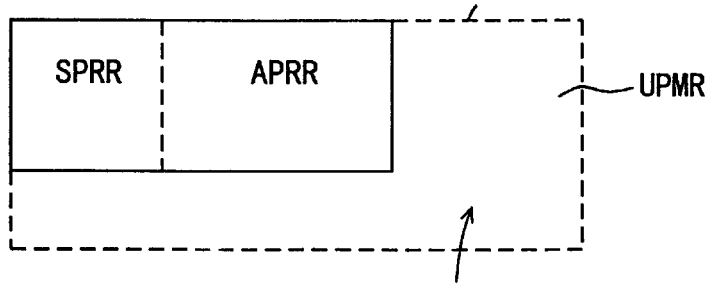

Furthermore, if a current driving capability is reduced with a storage capacity or the like taken into account, pump modules arranged in standby pump module region SPRR and active pump module region APRR are used, as shown in FIG. 21C. A remaining region UPMR of pump module arranging region PMLR has a non-used pump module arranged therein. More specifically, pump module arranging region PMLR as shown in FIG. 21C has the same pump module layout area as pump module arranging region PMLR as shown in FIG. 21A. Depending on a required current supplying capability, there is provided an interconnection lines only to a pump module actually used. In the region UPMR, there is arranged a pump module not used without any interconnection line thereto. In this case, simply with an interconnection mask, a current supplying capability can be reduced to be adapted to a reduction in storage capacity. If more pump modules are to be additionally provided, the number of pump modules is increased in each pump row block, as shown previously in FIG. 6. In contrast, if a storage capacity is reduced, any of the schemes as shown in FIGS. 21B and 21C may be applied.

Figure 22A:
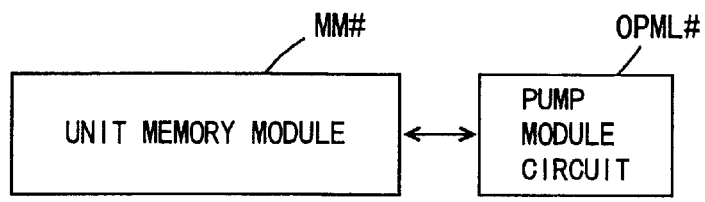
FIGS. 22A and 22B schematically show a configuration of the Vpp generation circuit in the eighth embodiment according to the present invention.

FIG. 22A schematically shows a basic configuration of a Vpp generation circuit. A pump module circuit OPML# having pump modules arranged in a matrix of rows and columns is arranged for a predetermined number of unit memory modules MM# each having, for example, a storage capacity of 1 Mbit. In pump module circuit OPML#, there is arranged pump modules optimized for a certain specification value. Pump module circuit OPML# is registered as a library, including a layout of a clock signal line.

Figure 22B:
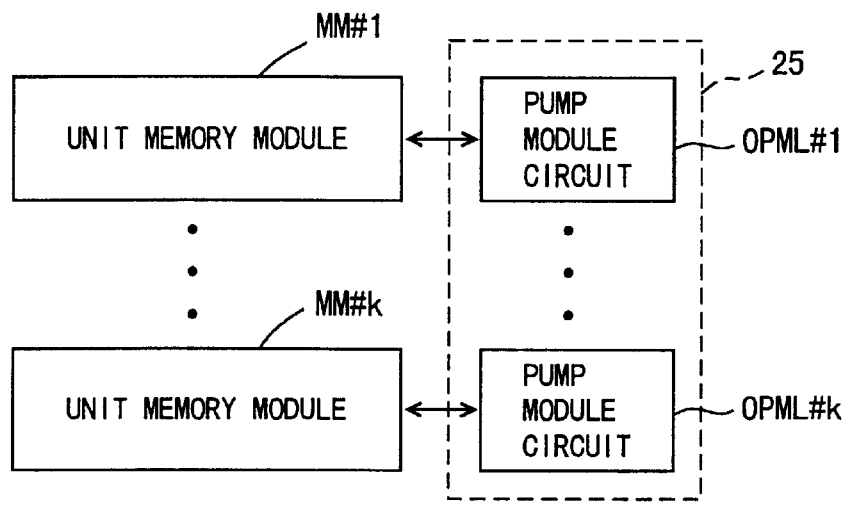

As shown in FIG. 22B, depending on the application of interest, a pump module circuit is used corresponding to a unit memory module. More specifically, if unit memory modules MM#1–MM#k are used, pump module circuits OPML#1–OPML#k are arranged, as Vpp generation circuit 25, for unit memory modules MM#1–MM#k. Pump module circuits OPML#1–OPML#k are optimized for unit memory modules MM#1–MM#k, respectively, and Vpp generation circuit 25 thus can have a current driving capability optimal for a DRAM circuit including unit memory modules MM#1–MM#k. In changing a specification such as power supply voltage, the number of pump modules that are used is reduced in each of pump module circuits OPML#1–OPML#k. Thus, the Vpp generation circuit can readily be optimized for the DRAM circuit for the application of the interest.

Although in FIG. 22B pump module circuits are shown being distributed in arrangement to correspond to respective memory modules, these pump module circuits are arranged collectively in a Vpp generation circuit region. A clock signal line is also included in a library and the pump module circuits can be readily increased/decreased in number.

Figure 23:
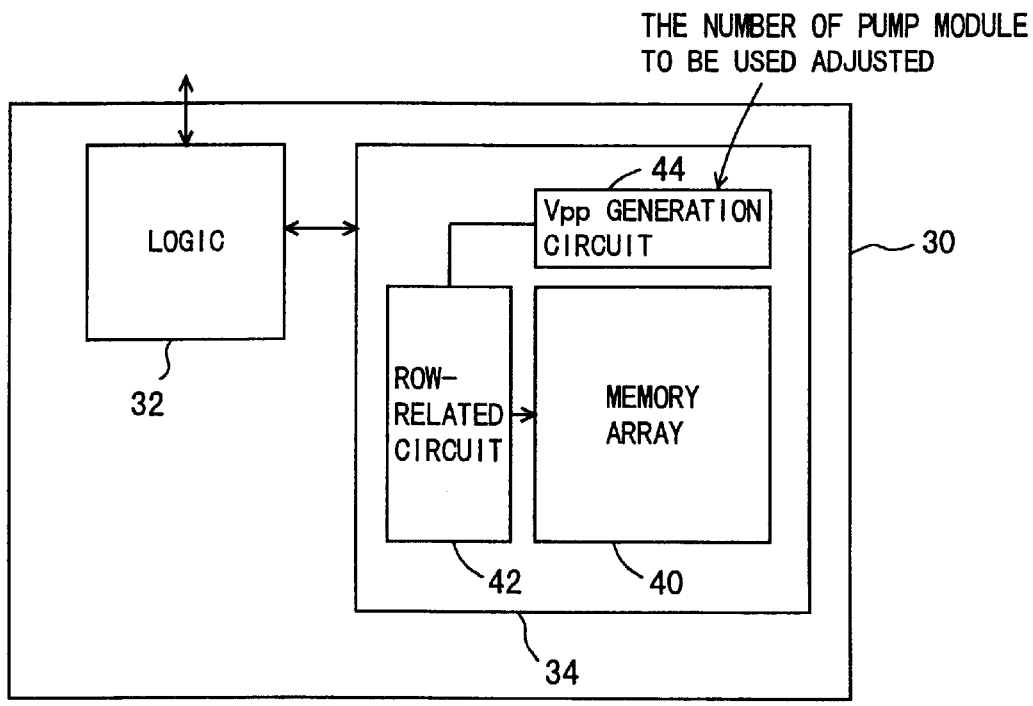
FIG. 23 schematically shows a configuration of a semiconductor integrated circuit device including a Vpp generation circuit in accordance with the present invention.
Figure 24:
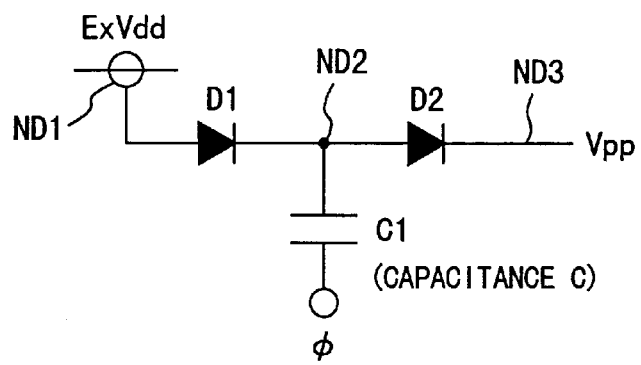
FIG. 24 shows one example of a configuration of a conventional Vpp generation circuit.
Figure 25:
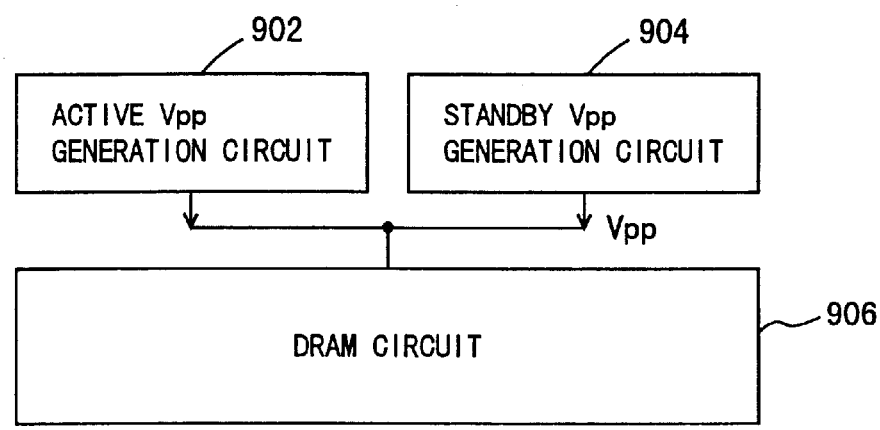
FIG. 25 schematically shows a configuration of a Vpp generating portion of a conventional DRAM.
Figure 26:
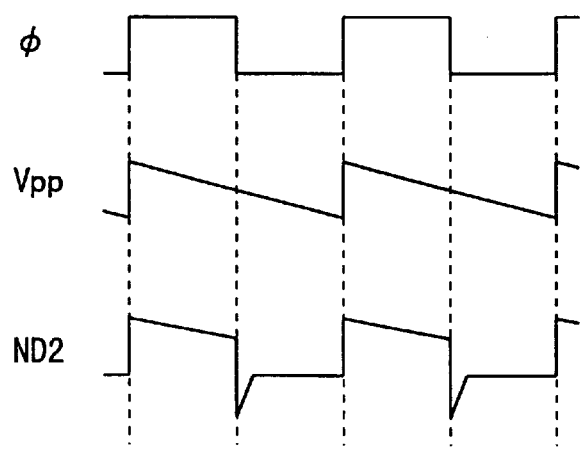
FIG. 26 is a signal waveform diagram representing an operation of the Vpp generation circuit shown in FIG. 24.
Figure 27:
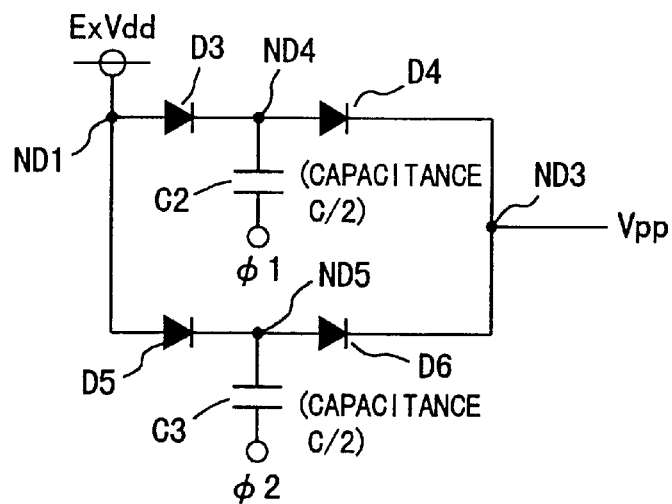
FIG. 27 shows another configuration of the conventional Vpp generation circuit.
Figure 28:
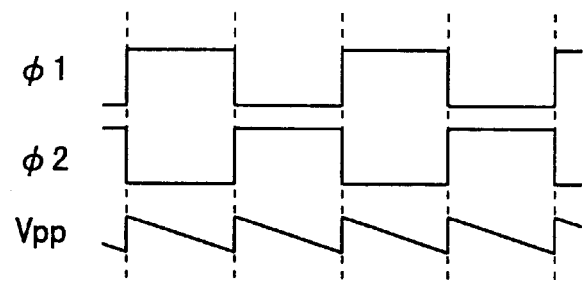
FIG. 28 is a signal waveform diagram representing an operation of the Vpp generation circuit shown in FIG. 27.
Figure 29:
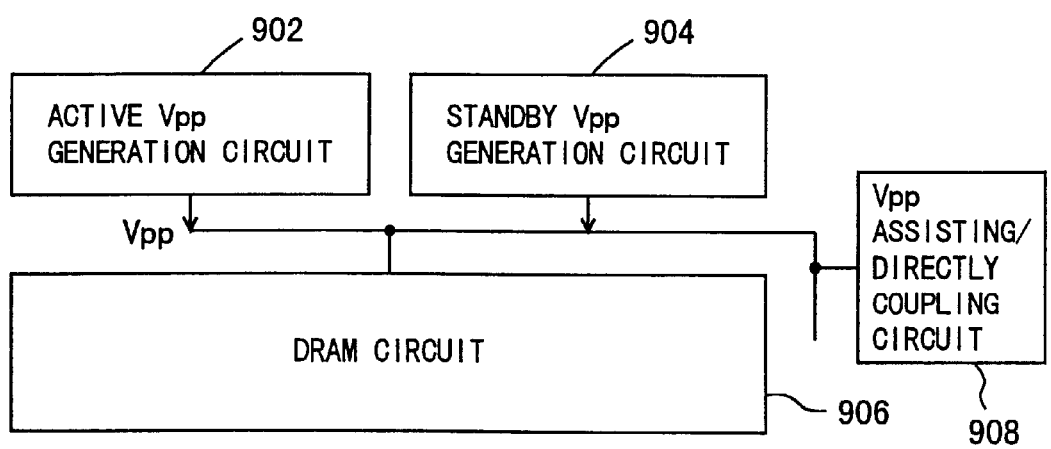
FIG. 29 schematically shows another configuration of the Vpp generating portion of the conventional DRAM.

FIG. 23 shows an example of a configuration of a DRAM including a Vpp generation circuit in accordance with the present invention. Referring to FIG. 23, a system LSI 30 includes a logic 32 and a DRAM 34. Logic 32 and DRAM 34 are integrated on a common semiconductor chip. DRAM circuit 34 includes a memory array 40 having memory cells arranged therein, a row-related circuit 42 performing an operation related to selection of a row in memory array 42, and a Vpp generation circuit 44 transmitting boosted voltage Vpp to row-related circuit 42. Vpp generation circuit 44 has the number of pump modules used therein adjusted depending on the storage capacity of memory array 40. Furthermore, when the configuration of FIG. 22A is used, the number of pump module circuits is adjusted. In row-related circuit 42, boosted voltage Vpp is used by a row decoder decoding a row. address signal, a word line drive circuit driving a selected word line, a bit line isolation instructing signal generation circuit in a shared sense amplifier configuration, a bit line precharge/equalization instructing signal generation circuit, and the like.

Therefore, if an embedded DRAM is used in system LSI 30 as shown in FIG. 23 and it has a specification to be changed depending on the application of interest, Vpp generation circuit 44 having an optimized current driving capability can be readily implemented.

As described above, according to the eighth embodiment, a Vpp generation circuit can have an adjustable number of pump modules arranged therein with a storage capacity or the like taken into consideration, and there can be readily implemented a Vpp generation circuit having an optimal current supplying capability corresponding to storage capacity, for example.

Other Applications

While the above description is provided referring to boosted voltage Vpp, the present invention is applicable to any circuit performing a charge pump operation to generate an internal voltage and the present invention is also applicable for example to a substrate bias generation circuit generating a negative substrate bias voltage.

Furthermore, the DRAM mentioned above is not limited to an. embedded DRAM and the present invention is applicable to a typical DRAM (a general-purpose DRAM and an SDRAM (Synchronous DRAM) operating in a single data rate (SDR) mode or a double data rate (DR) mode.

Furthermore, the present invention is applicable if for example as in a flash memory, the number of bits to be collectively written varies with a different specification and a high voltage generation circuit has a current supplying capability to be changed when a high voltage is used in programming the same.

As described heretofore, in accordance with the present invention, a plurality of pump module are arranged and a control circuit sets the number of pump modules to be activated. Thus, the number of pump modules to be activated can be changed depending on a mode of operation and a pump module selectively activated depending on the mode of operation can be commonly used, to reduce the area occupied by an internal voltage generation circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal voltage generation circuit comprising:
    a plurality of pump modules, coupled commonly and in parallel to an internal voltage transmission line, each for generating an internal voltage on said internal voltage transmission line through a pumping operation when activated; and
    control circuitry coupled with said plurality of pump modules and including a setting circuit for setting a number of one or more pump modules to be activated at a time in said plurality of pump modules, for generating a control signal for selectively activating the one or more pump modules by the number set by said setting circuit for transmission to the pump modules.

2. The internal voltage generation circuit according to claim 1, wherein said plurality of pump modules have a common pumping capability.

3. The internal voltage generation circuit according to claim 1, wherein
    said plurality of pump modules are arranged in rows and columns; and
    said control circuitry further includes a group of first activation signal lines arranged for the rows of the pump modules and each extending in a direction of the row, and a group of second activation signal lines provided for the columns of the pump modules and extending in a direction of the column.

4. The internal voltage generation circuit according to claim 1, wherein said plurality of pump modules are divided into a plurality of groups each receiving a pumping clock signal having a different phase.

5. The internal voltage generation circuit according to claim 1, wherein each of the pump modules includes a charging assisting element for charging an output node according to an externally applied voltage, said internal voltage being generated at said output node.

6. The internal voltage generation circuit according to claim 1, wherein each of the pump modules includes a directly coupling element for coupling an external power supply node with an output node when rendered conductive, said internal voltage being generated at said output node.

7. The internal voltage generation circuit according to claim 1, further comprising a divider circuit, provided for a predetermined number of the pump modules, for frequency-dividing a received clock signal to generate a frequency-divided clock signal, each pump module including a charge pump circuit responsive to said frequency-divided clock signal received from a corresponding divider circuit for performing a charge pump operation to generate said internal voltage at an output node thereof.

8. The internal voltage generation circuit according to claim 1, further comprising a divider circuit provided for a predetermined number of the pump modules, for frequency-dividing e a received clock signal to generate a plurality of frequency-divided clock signals having phases different from each other, wherein each of the pump modules includes a plurality of charge pump circuits, provided corresponding to the respective frequency-divided clock signals received from a corresponding divider circuit, responsive to corresponding frequency-divided clock signals for performing a charge pump operation to commonly generate said internal voltage at their respective output nodes.

9. The internal voltage generation circuit according to claim 1, wherein each of the pump modules includes:

a level conversion circuit coupled with an output node generating said internal voltage, for converting a direct-coupling instruction signal to a voltage level on said output node; and a switching element responsive to a signal outputted from said level conversion circuit, for coupling an external power supply node to said output node.

10. The internal voltage generation circuit according to claim 9, wherein said internal voltage is a boosted voltage higher than a power supply voltage and said switching element is a p-channel insulated gate field effect transistor.

11. The internal voltage generation circuit according to claim 1, wherein said plurality of pump modules are arranged in a matrix, and said internal voltage generation circuit further comprises:

at least one global clock signal line arranged in an interconnection channel region arranged extending in a first direction, for transmitting a pump clock signal for said plurality of pump modules; and a plurality of local clock transmission lines, provided corresponding to groups of pump modules arranged being aligned in said matrix in a second direction orthogonal to said first direction, each for transmitting the pump dock signal on said global clock signal line to a corresponding group of pump modules.

12. The internal voltage generation circuit according to claim 11, wherein:

said at least one global clock signal line includes a plurality of global clock signal lines transmitting a plurality of clock signals having phases different from each other; and said plurality of local clock transmission lines are provided corresponding to said plurality of global clock signal lines and transmit the dock signals on corresponding global signal lines to the respective groups of pump modules.

13. The internal voltage generation circuit according to claim 7, wherein said divider circuit is activated in response to an activation signal outputted from said control circuitry.

14. The internal voltage generation circuit according to claim 8, wherein said divider circuit is activated in response to an activation signal outputted from said control circuitry.

15. The internal voltage generation circuit according to claim 1, further comprising:

a divider circuit provided for each predetermined number of the pump modules, for frequency-dividing a received clock signal and generating first and second pump clock signals having phases different from each other; and a select circuit, provided corresponding to said divider circuit, responsive to a select signal for selecting one of said first and second pump clock signals, wherein each of the pump modules includes first and second pump circuits, provided corresponding to said first pump clock signal outputted from a corresponding divider circuit and a selected pump clock signal outputted from a corresponding select circuit, respectively, responsive to the respective pump clock signals for performing a charge pump operation to generate said internal voltage.

16. The internal voltage generation circuit according to claim 1, wherein said plurality of pump modules comprise a first group of pump modules arranged in a first region for operating in a standby cycle and in an active cycle to generate said internal voltage through the charge pumping operation, and a second group of pump modules arranged in a second region different from the first region for operating in the active cycle to generate said internal voltage through the charge pumping operation.

17. The internal voltage generation circuit according to claim 1, wherein said plurality of pump modules constitute a pump module circuit for supplying the internal voltage to a unit memory module having a basic storage capacity, and the pump module circuit is arranged corresponding in number to the unit memory module(s).

18. The internal voltage generation circuit according to claim 1, wherein said plurality of pump modules are divided into groups in at least one of row and column direction; and said control circuitry further includes a group of activation signal lines arranged for the groups of the pump modules and each extending along a corresponding group of pump modules.

* * * * *